(12) United States Patent
Hirayama et al.

(10) Patent No.: US 11,691,389 B2
(45) Date of Patent: Jul. 4, 2023

(54) RESIN COMPOSITION, PREPREG, METAL FOIL WITH RESIN, LAMINATE, PRINTED WIRING BOARD, AND METHOD FOR PRODUCING RESIN COMPOSITION

(71) Applicant: Showa Denko Materials Co., Ltd., Tokyo (JP)

(72) Inventors: Yuya Hirayama, Tokyo (JP); Takayo Kitajima, Tokyo (JP); Kenichi Tomioka, Tokyo (JP); Keisuke Kushida, Tokyo (JP); Minoru Kakitani, Tokyo (JP); Hiroshi Shimizu, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 314 days.

(21) Appl. No.: 17/109,323

(22) Filed: Dec. 2, 2020

(65) Prior Publication Data
US 2021/0079172 A1 Mar. 18, 2021

Related U.S. Application Data

(62) Division of application No. 16/300,692, filed as application No. PCT/JP2017/018157 on May 15, 2017, now abandoned.

(30) Foreign Application Priority Data

May 13, 2016 (JP) ................................. 2016-097483
May 13, 2016 (JP) ................................. 2016-097484

(51) Int. Cl.
*C08J 5/24* (2006.01)
*B32B 27/30* (2006.01)
*B32B 27/38* (2006.01)
*C08L 33/08* (2006.01)
*B32B 15/20* (2006.01)
*H05K 1/03* (2006.01)
*B32B 15/08* (2006.01)
*C08F 20/12* (2006.01)
*C08L 101/00* (2006.01)
*C08F 220/18* (2006.01)
*C08J 3/11* (2006.01)
*C08L 33/06* (2006.01)
*C08L 33/10* (2006.01)
*C08L 33/12* (2006.01)

(52) U.S. Cl.
CPC .............. *B32B 15/20* (2013.01); *B32B 15/08* (2013.01); *C08F 20/12* (2013.01); *C08F 220/1802* (2020.02); *C08F 220/1804* (2020.02); *C08J 3/11* (2013.01); *C08J 5/244* (2021.05); *C08L 33/06* (2013.01); *C08L 33/08* (2013.01); *C08L 101/00* (2013.01); *H05K 1/0326* (2013.01); *H05K 1/0353* (2013.01); *H05K 1/0366* (2013.01); *C08J 2300/24* (2013.01); *C08J 2333/06* (2013.01); *C08J 2333/08* (2013.01); *C08J 2333/10* (2013.01); *C08J 2463/00* (2013.01); *C08L 2201/56* (2013.01)

(58) Field of Classification Search
None
See application file for complete search history.

(56) References Cited

U.S. PATENT DOCUMENTS

| 6,359,067 B1 | 3/2002 | Miyawaki et al. |
| 8,309,631 B2 | 11/2012 | Tomioka |
| 2011/0097212 A1 | 4/2011 | Thompson et al. |
| 2012/0009385 A1 | 1/2012 | Masataka et al. |
| 2012/0288659 A1 | 11/2012 | Hoshi |
| 2016/0002460 A1 | 1/2016 | Nomura |

FOREIGN PATENT DOCUMENTS

| CN | 102112536 A | 6/2011 | |
| CN | 102203181 A | 9/2011 | |
| JP | 8-283535 A | 10/1996 | |
| JP | 2001-323131 A | 11/2001 | |
| JP | 2002-134907 A | 5/2002 | |
| JP | 2002-371190 A | 12/2002 | |
| JP | 2006-307196 A | 11/2006 | |
| JP | 2011-021174 A | 2/2011 | |
| JP | 2011162577 A * | 8/2011 | ............... C09J 7/04 |
| JP | 2011-246586 A | 12/2011 | |
| JP | 2013-136712 A | 7/2013 | |
| JP | 2015-168714 A | 9/2015 | |
| JP | 2016-047921 A | 4/2016 | |
| JP | 2017-002134 A | 1/2017 | |
| JP | 2017-110104 A | 6/2017 | |
| WO | 2009/101961 A1 | 8/2009 | |
| WO | 2011/040442 A1 | 4/2011 | |

(Continued)

OTHER PUBLICATIONS

Machine translation of JP-2011162577-A (no date).*
Teiichi Inada, Tetsuro Iwakura, Keiichi Hatakeyama, Michio Mashino, Takayuki Matsuzaki, "Reaction-Induced Phase Separation of Epoxy Resin/ Acrylic Polymer Alloy and Its Application to Die-Bonding Film", Hitachi Kasei Technical Report, No. 47, Hitachi Chemical Co., Ltd., Jul. 2006, pp. 15 to 20; Cited in ISR.

(Continued)

*Primary Examiner* — Michael J Feely
(74) *Attorney, Agent, or Firm* — Fitch, Even, Tabin & Flannery, LLP

(57) ABSTRACT

The present invention relates to a resin composition including an acrylic polymer (A) and a thermosetting resin (B), wherein a phase separation structure of a first phase containing the acrylic polymer (A) and a second phase containing the thermosetting resin (B) is formed, and an average domain size of the second phase is 20 μm or less.

13 Claims, 5 Drawing Sheets

(56) References Cited

FOREIGN PATENT DOCUMENTS

WO 2014/142024 A1 9/2014

OTHER PUBLICATIONS

Isao Ichikawa, Toshio Sugizaki, Shuichi Akasaka, Shigeo Asai, Quantitative analysis of the phase-separated structure and mechanical properties of acrylic copolymer/epoxy thermosetting resin composites, Polymer Journal, Oct. 28, 2015, 47, 779-788; Cited in ISR.
Isao Ichikawa et al., Quantitative analysis of the phase-separated structure and mechanical properties of acrylic copolymer/epoxy thermosetting resin composites, Polymer Journal (2015), The Society of Polymer Science, pp. 1-10 (cited in an office action dated Apr. 27, 2021 in corresponding Korean Appln. 10-2018-7031995).

* cited by examiner

[Fig. 1]
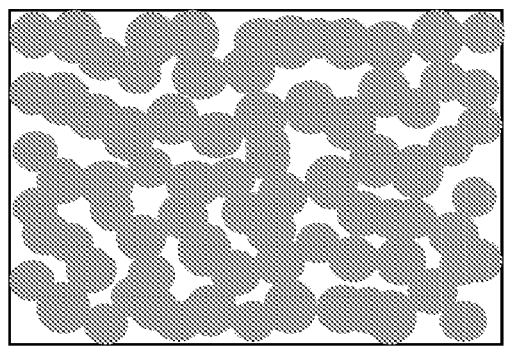
[Fig. 2]
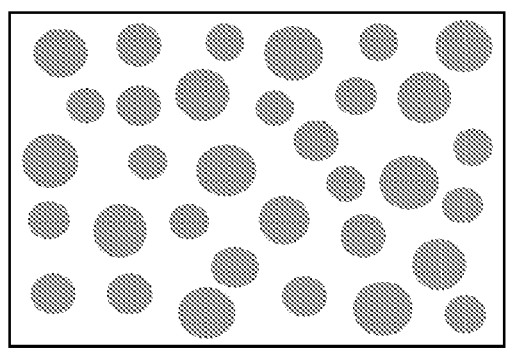
[Fig. 3]
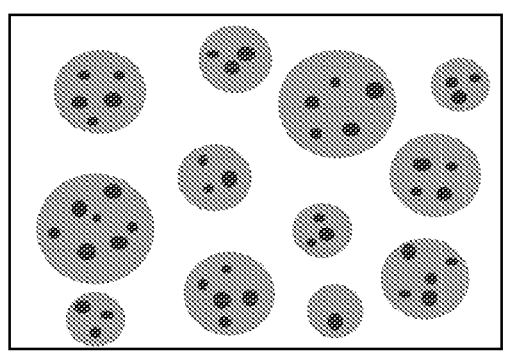
[Fig. 4]

[Fig. 5]
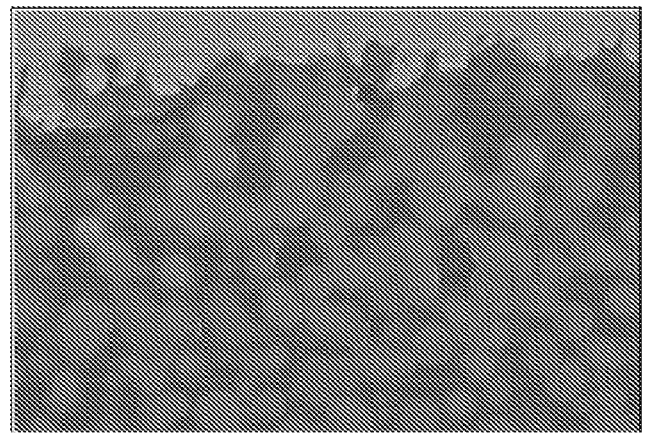
[Fig. 6]
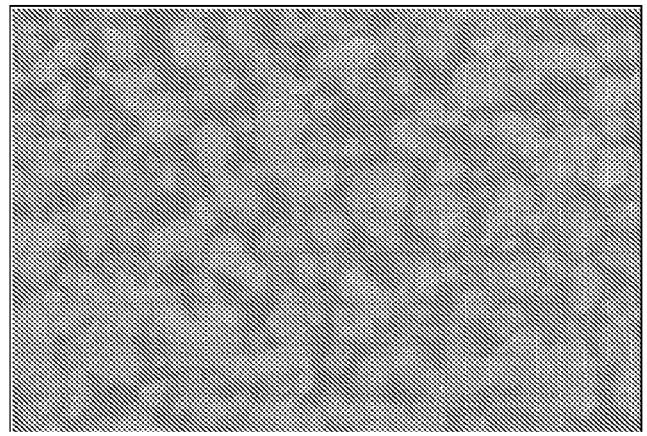
[Fig. 7]

[Fig. 8]
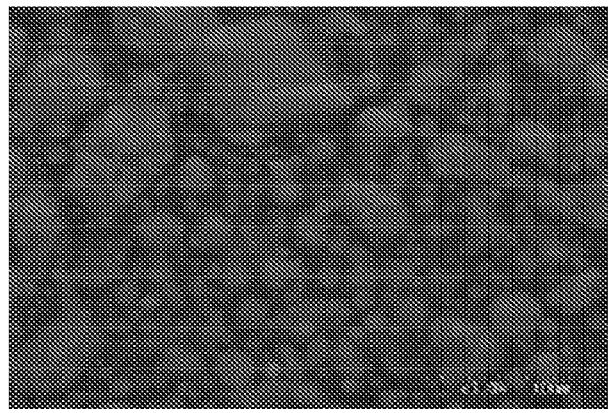
[Fig. 9]
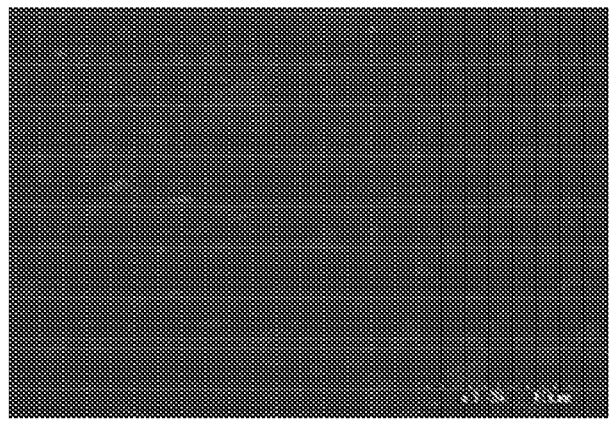
[Fig. 10]
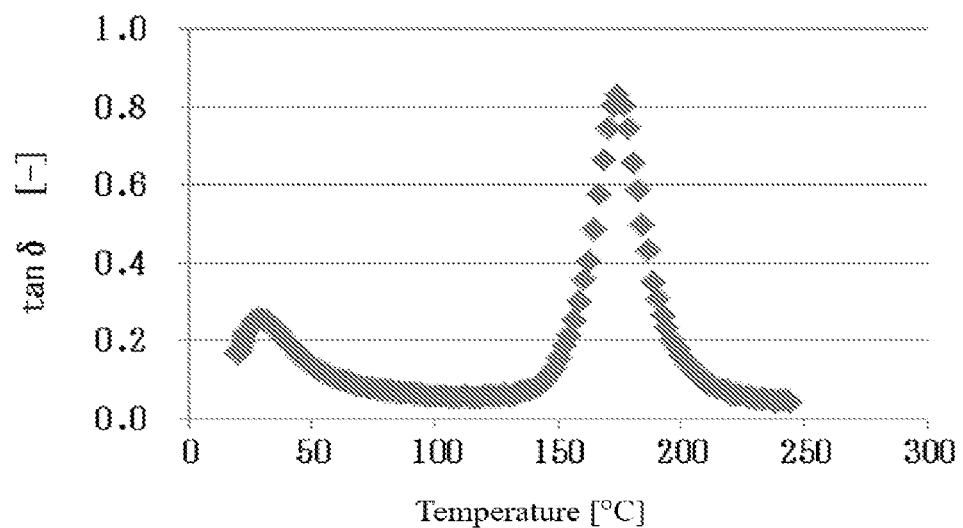

[Fig. 11]
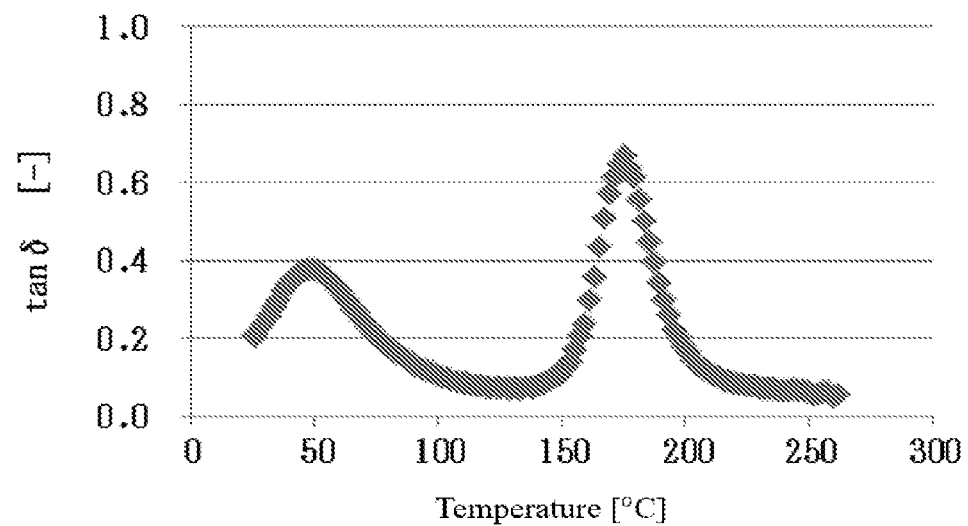
[Fig. 12]
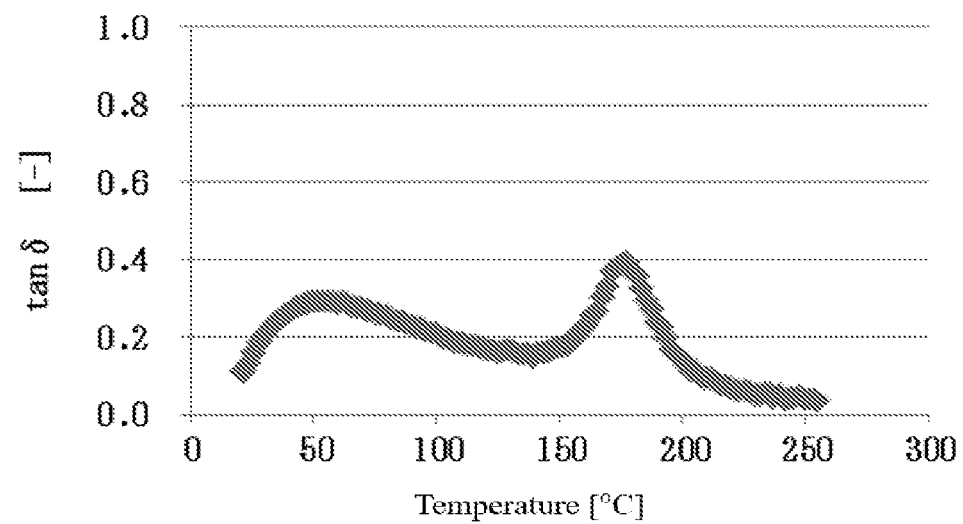

[Fig. 13]
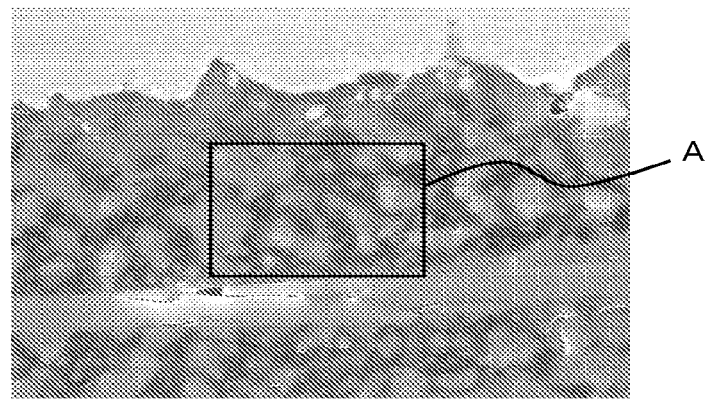
(a)
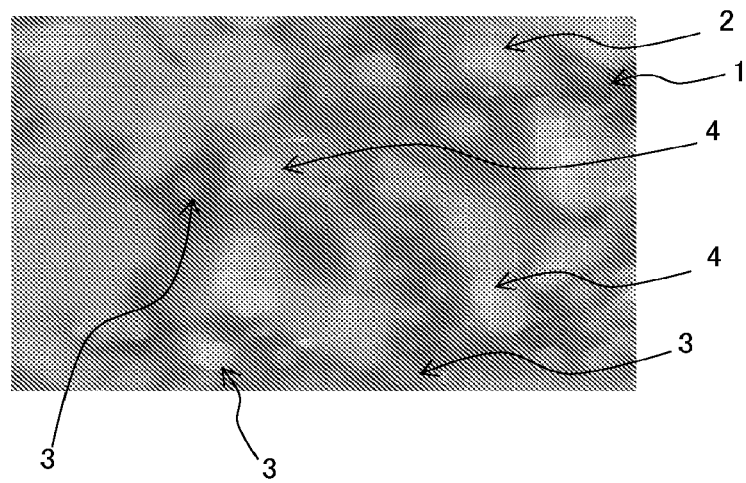
(b)

RESIN COMPOSITION, PREPREG, METAL FOIL WITH RESIN, LAMINATE, PRINTED WIRING BOARD, AND METHOD FOR PRODUCING RESIN COMPOSITION

CROSS-REFERENCE TO RELATED APPLICATIONS

This application is a divisional application of Ser. No. 16/300,692 filed Nov. 12, 2018, which is a U.S. national phase application filed under 35 U.S.C. § 371 of International Application No. PCT/JP2017/018157, filed May 15, 2017, designating the United States, which claims benefit from Japanese Patent Application 2016-097483, filed May 13, 2016, and Japanese Patent Application 2016-097484, filed May 13, 2016, all of which are hereby incorporated herein by reference in their entirety.

TECHNICAL FIELD

The present invention relates to a resin composition, a prepreg, a resin coated metal foil, a laminate plate, a printed wiring board, and a method for producing a resin composition.

BACKGROUND ART

With the rapid spread of information electronic equipment, downsizing and thinning of electronic equipment are being advanced, and requirements of high densification and high functionalization are being increased for printed wiring boards to be mounted thereon, too.

The high densification of printed wiring boards is further suitably achieved by making the thickness of a glass cloth serving as a base material thinner, for example, by regulating the thickness to 30 μm or less, and therefore, a prepreg provided with such a glass cloth is recently developed and marketed. According to this, while the high densification of printed wiring boards is being advanced more and more, following this, it becomes difficult to secure satisfactory heat resistance and insulation reliability in the printed wiring boards, adhesive properties between a wiring layer and an insulating layer, and so on.

A wiring board material to be used for such a high-function printed wiring board is required to have heat resistance, electric insulation properties, long-term reliability, adhesive properties, and so on. In addition, a flexible wiring board material that is exemplified as one of these high-function printed wiring boards is also required to have properties, such as flexibility and low elasticity, in addition to the aforementioned properties.

Furthermore, in substrates having a ceramic component mounted thereon, a lowering of connection reliability of components to be generated due to a difference in thermal expansion coefficient between the ceramic component and the substrate and external shock is a serious problem, too. As a method of solving this problem, stress relaxation from the substrate side is advocated.

As wiring board materials satisfying these requirements, specifically, there are proposed a resin composition in which a thermosetting resin is blended in an acrylic rubber-based polymer, such as an acrylonitrile butadiene-based resin and a carboxy-containing acrylonitrile butadiene resin; a resin composition in which a thermosetting resin is blended in a thermoplastic resin, such as a terminal-modified polyethersulfone; and so on (see, for example, PTLs 1 to 3).

CITATION LIST

Patent Literature

PTL 1: JP 8-283535 A
PTL 2: JP 2002-134907 A
PTL 3: JP 2002-371190 A

SUMMARY OF INVENTION

Technical Problem

Acrylic polymers are a polymer that is excellent particularly in a balance among low elasticity, elongation percentage, bendability (flexibility), electric insulation properties, and so on, and it is required to allow the resulting wiring board to thoroughly exhibit these excellent properties.

For example, a resin composition obtained by mixing an acrylic polymer having a functional group and a thermosetting resin has a structure in a state where the acrylic polymer and the thermosetting resin are just connected with each other and dispersed with regularity and is capable of forming a phase separation structure composed of a sea phase in which a main component thereof is the acrylic polymer and an island phase where a main component thereof is the thermosetting resin (for example, an epoxy resin). Though such a resin composition is desired to have both excellent characteristic features of both the acrylic polymer and the thermosetting resin, the foregoing resin composition was not one which is satisfactorily provided with the both excellent characteristic features.

Examples of the characteristic features of the acrylic polymer having a functional group include low elasticity, high elongation percentage, and easy introduction of a functional group, and examples of the characteristic features of the thermosetting resin include high insulation reliability, high heat resistance, and high glass transition temperature (Tg). However, it was difficult to control and realize the respective characteristic features according to the use environment and application.

An object of the present invention is to provide a resin composition that is excellent in low elasticity, high elongation percentage, insulation reliability, heat resistance, and adhesive properties to a metal foil, a prepreg, a resin coated metal foil, a laminate plate, a printed wiring board, and a method for producing a resin composition.

Solution to Problem

The present invention is concerned with the following [1] to [15].

[1] A resin composition including an acrylic polymer (A) and a thermosetting resin (B), wherein a phase separation structure of a first phase containing the acrylic polymer (A) and a second phase containing the thermosetting resin (B) is formed, and an average domain size of the second phase is 20 μm or less.

[2] The resin composition as set forth in the above [1], wherein the acrylic polymer (A) is an acrylic polymer containing a (meth)acrylic acid ester-derived structural unit represented by the following general formula (A1).

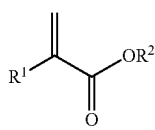

(A1)

In the formula (A1), $R^2$ represents an alkyl group, a cycloalkyl group, a cycloalkylalkyl group, an aryl group, or an aralkyl group; and $R^1$ represents a hydrogen atom or a methyl group.

[3] The resin composition as set forth in the above [1] or [2], wherein a solubility parameter (SP value) of the acrylic polymer (A) is from 9.0 to 12.0.

[4] The resin composition as set forth in any of the above [1] to [3], wherein a weight average molecular weight of the acrylic polymer (A) is from 100,000 to 1,500,000.

[5] The resin composition as set forth in any of the above [1] to [4], wherein the content of the acrylic polymer (A) is from 10 to 50 parts by mass based on 100 parts by mass of the total solid content of the resin composition.

[6] The resin composition as set forth in any of the above [1] to [5], wherein the thermosetting resin (B) is at least one selected from the group consisting of an epoxy resin, a cyanate resin, a bismaleimide, an addition polymer of a bismaleimide and a diamine, a phenol resin, a resole resin, an isocyanate resin, triallyl isocyanurate, triallyl cyanurate, and a vinyl group-containing polyolefin compound.

[7] The resin composition as set forth in any of the above [1] to [6], wherein the phase separation structure is a sea-island structure, a sea phase is constituted of the first phase, and an island phase is constituted of the second phase.

[8] The resin composition as set forth in any of the above [1] to [7], wherein a solubility parameter (SP value) of the thermosetting resin (B) is from 9.0 to 15.0.

[9] The resin composition as set forth in any of the above [1] to [8], wherein an absolute value of a difference between the solubility parameter (SP value) of the acrylic polymer (A) and the solubility parameter (SP value) of the thermosetting resin (B) is from 0.1 to 5.0.

[10] A prepreg, which is prepared by impregnating a base material with the resin composition as set forth in any of the above [1] to [9] and then drying.

[11] A resin coated metal foil, which is prepared by laminating the resin composition as set forth in any of the above [1] to [9] and a metal foil.

[12] A laminate plate, which is prepared by laminating the prepreg as set forth in the above [10] or the resin coated metal foil as set forth in the above [11], and then heating and pressurizing.

[13] A printed wiring board, which is prepared by subjecting the laminate plate as set forth in the above [12] to circuit processing.

[14] A method for producing a resin composition including an acrylic polymer (A) and a thermosetting resin (B), the method including the following Steps 1 to 4:

Step 1: a step of determining a storage elastic modulus of a cured material of a desired resin composition;

Step 2: a step of specifying an absolute value X of a difference between a solubility parameter (SP value) of the acrylic polymer (A) and a solubility parameter (SP value) of the thermosetting resin (B) on a basis of a correlation between the absolute value X and the storage elastic modulus of the cured material;

Step 3: a step of selecting the acrylic polymer (A) and the thermosetting resin (B) so as to take the absolute value X as specified in the Step 2; and Step 4: a step of mixing the acrylic polymer (A) and the thermosetting resin as selected in the Step 3.

[15] A method for producing a resin composition including an acrylic polymer (A) and a thermosetting resin (B), the method including the following Steps 1 to 4:

Step 1: a step of determining heat resistance of a cured material of a desired resin composition;

Step 2: a step of specifying an absolute value X of a difference between a solubility parameter (SP value) of the acrylic polymer (A) and a solubility parameter (SP value) of the thermosetting resin (B) on a basis of a correlation between the absolute value X and the heat resistance of the cured material;

Step 3: a step of selecting the acrylic polymer (A) and the thermosetting resin (B) so as to take the absolute value X specified in the Step 2; and Step 4: a step of mixing the acrylic polymer (A) and the thermosetting resin as selected in the Step 3.

Advantageous Effects of Invention

In accordance with the present invention, it is possible to provide a resin composition that is excellent in low elasticity, high elongation percentage, insulation reliability, heat resistance, and adhesive properties to a metal foil, a prepreg, a resin coated metal foil, a laminate plate, a printed wiring board, and a method for producing a resin composition.

BRIEF DESCRIPTION OF DRAWINGS

FIG. 1 is a model view indicating the case where a phase separation structure of a resin composition is a continuous spherical structure.

FIG. 2 is a model view indicating the case where a phase separation structure of a resin composition is a sea-island structure.

FIG. 3 is a model view indicating the case where a phase separation structure of a resin composition is a composite dispersion phase structure.

FIG. 4 is a model view indicating the case where a phase separation structure of a resin composition is a co-continuous phase structure.

FIG. 5 is an electron microscopic photograph indicating a cross-sectional structure as one example of a cured material having a sea-island structure obtained in a blending system of Example 6 from which a component (D) is removed.

FIG. 6 is an electron microscopic photograph indicating a cross-sectional structure as one example of a cured material having a composite dispersion phase structure obtained in Example 6 of the present invention.

FIG. 7 is an electron microscopic photograph indicating a cross-sectional structure as one example of a cured material having a sea-island structure obtained in Example 2 of the present invention.

FIG. 8 is an electron microscopic photograph indicating a cross-sectional structure as one example of a cured material having a sea-island structure obtained in Example 7 of the present invention.

FIG. 9 is an electron microscopic photograph indicating a cross-sectional structure as one example of a cured material having a sea-island structure obtained in Example 12 of the present invention.

FIG. 10 is a curve of a loss factor tan δ of a cured material obtained in Example 2 of the present invention.

FIG. 11 is a curve of a loss factor tan δ of a cured material obtained in Example 7 of the present invention.

FIG. 12 is a curve of a loss factor tan δ of a cured material obtained in Example 12 of the present invention.

FIG. 13 is an electron microscopic photographic indicating a cross-sectional structure as one example of a cured material containing a filler, as obtained from the resin composition of the present invention.

DESCRIPTION OF EMBODIMENTS

Embodiments of the present invention are hereunder described in detail, but it should be construed that the present invention is not limited by the following embodiments.

[Resin Composition]

The resin composition according to the embodiment of the present invention is a resin composition including an acrylic polymer (A) and a thermosetting resin (B), wherein a phase separation structure of a first phase containing the acrylic polymer (A) and a second phase containing the thermosetting resin (B) is formed, and an average domain size of the second phase is 20 μm or less.

<First Phase and Second Phase>

In the phase separation structure which the resin composition of the present invention forms, the first phase is a phase containing an acrylic polymer (A), the second phase is a phase containing a thermosetting resin (B), and an average domain size of the second phase is 20 μm or less.

By regulating the average domain size of the second phase within the aforementioned range, the characteristic features which the acrylic polymer (A) has, such as low elasticity, flexibility, and high elongation properties, can be conspicuously revealed; the characteristic features which the thermosetting resin (B) has, such as high elasticity and high strength, can be conspicuously revealed; or the both characteristic features can be revealed, as the need arises.

The first phase is a phase containing the acrylic polymer (A) as a main component of the resin components, and the second phase is a phase containing the thermosetting resin (B) as a main component of the resin components. Here, the main component of the resin component means a resin having the heist content among the resin components and is estimated on a basis of the content relative to the whole amount of the resin composition.

(Solubility Parameter (SP Value))

In general, the phase structure of the resin cured material is determined by a competition reaction between a phase separation rate and a curing reaction rate. For example, by making a difference between a solubility parameter (hereinafter also referred to as "SP value") of the acrylic polymer (A) and an SP value of the thermosetting resin (B) small, the phase separation rate becomes slow, whereby it becomes possible to control the average domain size of the second phase to a relatively small range as 20 μm or less.

The SP value of each of the acrylic polymer (A) and the thermosetting resin (B) can be determined in the following manner. That is, the SP value can be calculated from a structure of the material by the Fedors method. A total molar cohesive energy and a total molar molecular volume thereof are determined by totaling a molar cohesive energy and a molar molecular volume of the respective functional groups for constituting the structure of the material, as shown in the following Table 1, respectively. In the case where the structure contains a plurality of the same functional group, before the totaling, the molar cohesive energy and the molar molecular volume of the functional group may be multiplied with the number of the functional group included in the structure. The SP value is calculated according to the following expression (1).

TABLE 1

Molar cohesive energy and molar molecular volume
of each functional group (Fedors method)

| Functional group | Molar cohesive energy (E) [cal/mol] | Molar molecular volume (V) [cm³/mol] |
|---|---|---|
| $CH_3$ | 1125 | 33.5 |
| $CH_2$ | 1180 | 16.1 |
| CH | 820 | −1.0 |
| C | 350 | −19.2 |
| C=O | 4150 | 10.8 |
| C(=O)O | 4300 | 18.0 |
| 3-Membered ring | 750 | 18.0 |
| 5-Membered ring or more | 250 | 16.0 |

$$\delta_i = (\Delta E_i / \Delta V_i)^{1/2} \quad (1)$$

With respect to the respective symbols in the expression (1), δi represents an SP value; ΔEi represents a total molar cohesive energy; and ΔVi represents a total molar molecular volume.

Specifically, taking the case of acetone as an example, when the SP value is calculated by the aforementioned method, the following is given. In this case, the acetone is expressed as follows.

Structural formula: $CH_3-C(=O)-CH_3$

Number of members:

$CH_3$: 2

C=O: 1

From Table 1, the total molar cohesive energy (ΔEi) and the total molar molecular volume (ΔVi) are calculated as follows.

Total molar cohesive energy (ΔEi): (1125×2)+(4150× 1)=6400

Total molar molecular volume (ΔVi): (33.5×2)+ (10.8×1)=77.8

By applying this to the expression (1), the solubility parameter (SP value) is calculated as follows.

SP value: $\delta i = (\Delta E i / \Delta V i)^{1/2} = (6400/77.8)^{1/2} = 9.07$ For example, in the case of using an epoxy resin as the thermosetting resin (B), a phenol resin, an amine compound, or the like is occasionally jointly used as a curing agent. On that occasion, such a curing agent does not serve as a main component, and its amount is small, and therefore, its influence against the SP value of the thermosetting resin (B) is small. For that reason, as a calculation method of the SP value in the case of jointly using the epoxy resin and the curing agent, an SP value calculated from only the epoxy resin is adopted without taking into consideration the curing agent. This dealing is also the same in the case of a thermosetting resin other than epoxy resin. The phenol resin or the like is used in a relatively large amount among the curing agents of the epoxy resin, and therefore, in view of the fact that its SP value is a value close to the SP value of the epoxy resin, the influence of the curing agent can be minimized on determining the SP value of the thermosetting resin (B), and hence, such is preferred. The SP values described in the section of Examples and so on are values calculated in this way.

The SP value of the acrylic polymer (A) is preferably 9.0 to 12.0; more preferably 9.2 to 11.8, and still more preferably 9.4 to 11.6 from the viewpoint of low moisture absorption; and especially preferably 9.5 to 11.0 from the viewpoint of heat resistance. When the SP value of the acrylic polymer (A) is 9.0 or more, the heat resistance tends to be improved, and when it is 12.0 or less, the insulation reliability tends to be improved.

The SP value of the thermosetting resin (B) is preferably 9.0 to 15.0, more preferably 10.5 to 14.5, and still more preferably 12.0 to 14.3.

An absolute value of a difference between the SP value of the acrylic polymer (A) and the SP value of the thermosetting resin (B) is preferably 0.1 to 5.0, more preferably 0.11 to 4.9, still more preferably 0.12 to 4.8, and especially preferably 0.13 to 4.7. By allowing the absolute value of the difference between the SP values to fall within the aforementioned range, the average domain size of the second phase can be controlled to a relatively small range as 20 μm or less.

In the resin composition of the present invention, by regulating the absolute value of the difference between the SP value of the acrylic polymer (A) and the SP value of the thermosetting resin (B), physical properties of the resulting cured material can be regulated. For example, in the case where the absolute value of the difference between the SP value of the acrylic polymer (A) and the SP value of the thermosetting resin (B) is 3.0 to 5.0, there is a tendency that the characteristic features which the thermosetting resin (B) has, such as high elasticity and high strength, can be conspicuously revealed, while maintaining the characteristic features which the acrylic polymer (A) has, such as flexibility and high elongation properties. In addition, in the case where the absolute value of the difference between the SP values is 0.1 to 3.0, there is a tendency that the characteristic features which the acrylic polymer (A) has, such as low elasticity, flexibility, and high elongation properties, can be conspicuously revealed, while maintaining the characteristic features which the thermosetting resin (B) has, such as high strength.

When the absolute value of the difference between the SP values is 0.45 or less, the average domain size of the second phase becomes about 0.001 to 1.0 μm, and a domain of a nano size tends to be formed.

(Acrylic Polymer (A))

The acrylic polymer (A) is typically a polymer derived from a (meth)acrylic acid ester as a monomer.

The acrylic polymer (A) may be used alone or may be used in combination of two or more thereof.

The acrylic polymer (A) is preferably an acrylic polymer containing a (meth)acrylic acid ester-derived structural unit represented by the following general formula (A1).

In the present invention, the term "(meth)acrylic acid" indicates both "acrylic acid" and "methacrylic acid", and the same is also applicable to other analogous terms.

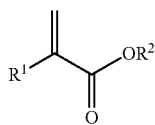

(A1)

In the formula (A1), $R^2$ represents an alkyl group, a cycloalkyl group, a cycloalkylalkyl group, an aryl group, or an aralkyl group; and $R^1$ represents a hydrogen atom or a methyl group.

The carbon number of the alkyl group represented by $R^2$ is preferably 1 to 20, more preferably 1 to 15, and still more preferably 2 to 10. Examples of the alkyl group include a methyl group, an ethyl group, a propyl group, a butyl group, and 2-ethylhexyl group. Such an alkyl group may have a substituent. Examples of the substituent of the alkyl group include an alicyclic hydrocarbon group, a hydroxy group, a halogen, an oxygen-containing hydrocarbon group, and a nitrogen-containing cyclic group.

The carbon number of the cycloalkyl group represented by $R^2$ is preferably 6 to 13, and more preferably 7 to 10. Examples of the cycloalkyl group include a cyclohexyl group, a norbornyl group, a tricyclodecanyl group, an isobornyl group, and an adamantyl group, and of these, a norbornyl group, a tricyclodecanyl group, and isobornyl group are preferred.

The carbon number of the cycloalkylalkyl group represented by $R^2$ is preferably 6 to 13, and more preferably 7 to 10. Examples of the cycloalkylalkyl group include a norbornylmethyl group and a tricyclodecanyl group.

The carbon number of the aryl group represented by $R^2$ is preferably 6 to 13, and more preferably 6 to 10. Examples of the aryl group include a phenyl group and a nonylphenyl group.

The carbon number of the aralkyl group represented by $R^2$ is preferably 7 to 15, and more preferably 7 to 11. Examples of the aralkyl group include a benzyl group and a 4-methylbenzyl group.

Examples of the (meth)acrylic acid ester include methyl (meth)acrylate, ethyl (meth)acrylate, propyl (meth)acrylate, butyl (meth)acrylate, hexyl (meth)acrylate, 2-ethylhexyl (meth)acrylate, isobutyl (meth)acrylate, ethylene glycol methyl ether (meth)acrylate, cyclohexyl (meth)acrylate, 2-hydroxyethyl (meth)acrylate, 2-hydroxypropyl (meth)acrylate, isobornyl (meth)acrylate, tricyclo[5.2.1,0(2,6)]deca-8-yl (meth)acrylate, isodecyl (meth)acrylate, octadecyl (meth)acrylate, lauryl (meth)acrylate, allyl (meth)acrylate, norbornylmethyl (meth)acrylate, tricyclodecylethyl (meth)acrylate, phenyl (meth)acrylate, nonylphenyl (meth)acrylate, benzyl (meth)acrylate, and 4-methylbenzyl (meth)acrylate. These may be used alone or may be used in combination of two or more thereof.

The acrylic polymer (A) is preferably an acrylic polymer having a crosslinking functional group provided therewith. Such an acrylic polymer can be obtained as a copolymer of a (meth)acrylic acid ester and a copolymerizable monomer having a crosslinking functional group (hereinafter also referred to simply as "crosslinking copolymerizable monomer"). Examples of the crosslinking copolymerizable monomer include monomers having a crosslinking functional group, such as a carboxy group, a hydroxy group, an amino group, a vinyl group, a glycidyl group, and an epoxy group. Of these, from the viewpoint of low moisture absorption and heat resistance, a crosslinking copolymerizable monomer having an epoxy group is preferred. Such a monomer is preferably a compound having a double bond.

Examples of the crosslinking copolymerizable monomer include monomers having a carboxy group, such as acrylic acid and methacrylic acid; monomers having an epoxy group, such as glycidyl acrylate and glycidyl methacrylate; monomers having a hydroxy group, such as hydroxyethyl acrylate, hydroxypropyl acrylate, hydroxyethyl methacrylate, and hydroxypropyl methacrylate; monomers having an amino group, such as dimethylaminoethyl acrylate, dimethylaminoethyl methacrylate, acrylamide, methacrylamide, dimethyl acrylamide, and dimethyl methacrylamide; and monomers having a cyano group, such as acrylonitrile.

These may be used alone or may be used in combination of two or more thereof. Of these, from the viewpoint of electric insulation reliability, monomers having a carboxy group, monomers having an epoxy group, monomers having a hydroxy group, and monomers having an amino group are preferred; and from the viewpoint of low moisture absorption and heat resistance, monomers having an epoxy group are more preferred, and glycidyl acrylate and glycidyl methacrylate are still more preferred.

The acrylic polymer (A) can also be obtained by using a polymerizable monomer, such as a (meth)acrylic acid ester other than that represented by the general formula (A1), acrylic acid N-vinylpyrrolidone, methacrylic acid N-vinylpyrrolidone, N-acryloylmorpholine, N-methacryloylmorpholine, an aromatic vinyl compound, and an N-substituted maleimide, together with the (meth)acrylic acid ester.

In the case where the acrylic polymer (A) is a copolymer of the (meth)acrylic acid ester and the crosslinking copolymerizable monomer, the use amount of the (meth)acrylic acid ester is preferably 70 to 99.5 parts by mass, more preferably 80 to 98 parts by mass, and still more preferably 90 to 97 parts by mass based on 100 parts by mass of a total mass of the (meth)acrylic acid ester and the crosslinking copolymerizable monomer.

The use amount of the crosslinking copolymerizable monomer is preferably 0.5 to 30 parts by mass, more preferably 2 to 25 parts by mass, and still more preferably 3 to 20 parts by mass based on 100 parts by mass of a total mass of the (meth)acrylic acid ester and the crosslinking copolymerizable monomer. By regulating the use amount to the foregoing range, a crosslinking structure is suitably formed between the first phase containing the acrylic polymer (A) and the second phase containing the thermosetting resin (B), and the heat resistance, the adhesive strength to a metal foil, the insulation reliability, and so on tend to be more improved.

In all of the raw material monomers of the acrylic polymer (A), a total content of the (meth)acrylic acid ester and the crosslinking copolymerizable monomer is preferably 80% by mass or more, more preferably 90% by mass or more, and still more preferably 95% by mass or more, and it may also be 100% by mass.

In the case where the acrylic polymer (A) has an epoxy group, its epoxy equivalent is preferably 2,000 to 18,000 g/eq, and more preferably 2,000 to 8,000 g/eq. When the epoxy equivalent is 2,000 g/eq or more, a lowering of a glass transition temperature of the cured material is suppressed, whereby the heat resistance of the substrate is thoroughly kept, whereas when it is 18,000 g/eq or less, the dimensional stability of the substrate tends to be kept without causing an excessive increase of the storage elastic modulus.

On copolymerizing glycidyl (meth)acrylate and other monomer copolymerizable with this, it is possible to adjust the epoxy equivalent of the acrylic polymer (A) by properly regulating a copolymerization ratio thereof.

As marketed products of the acrylic polymer (A) having an epoxy group, for example, "HTR-860" (a trade name, manufactured by Nagase ChemteX Corporation, epoxy equivalent: 2,900 g/eq) and "KH-CT-865" (a trade name, manufactured by Hitachi Chemical Company, Ltd., epoxy equivalent: 3,300 g/eq) are commercially available.

A weight average molecular weight of the acrylic polymer (A) is preferably 100,000 to 1,500,000; and from the viewpoint of low elasticity and an improvement of elongation percentage, it is more preferably 300,000 to 1,500,000, and still more preferably 300,000 to 1,100,000. When the weight average molecular weight of the acrylic polymer (A) is 100,000 or more, the phase separation structure tends to be readily formed without causing complete compatibilization between the acrylic polymer (A) and the thermosetting resin (B), whereas when it is 1,500,000 or less, the acrylic polymer (A) and the thermosetting resin (B) are readily dissolved in a solvent, and handling properties and dispersibility tend to be excellent.

The acrylic polymer (A) may also be a combination of two or more acrylic polymers having a different weight average molecular weight from each other. In this case, the SP value of the acrylic polymer (A) is calculated through proportional division of the SP values of the respective acrylic polymers in accordance with the blending amounts thereof.

The aforementioned weight average molecular weight is a value measured by means of gel permeation chromatography (GPC) analysis and means a value expressed in terms of standard polystyrene. The GPC analysis can be performed using tetrahydrofuran (THF) as an eluting solution.

The content of the acrylic polymer (A) in the resin composition of the present invention is preferably 10 to 50 parts by mass based on 100 parts by mass of the total solid content of the resin composition. When the content of the acrylic polymer (A) is 10 parts by mass or more, the low elasticity and the flexibility that are excellent characteristic features of the acrylic polymer (A) tend to be satisfactorily obtained, whereas when it is 50 parts by mass or less, the satisfactory adhesive strength to a metal foil is obtained.

From the viewpoint of low elasticity and flexibility, the content of the acrylic polymer (A) is more preferably 20 to 50 parts by mass, and still more preferably 30 to 50 parts by mass based on 100 parts by mass of the total solid content of the resin composition.

Form the viewpoint of obtaining the excellent adhesive strength to a metal foil, the content of the acrylic polymer (A) is more preferably 10 to 40 parts by mass, and still more preferably 10 to 30 parts by mass based on 100 parts by mass of the total solid content of the resin composition.

Here, the "solid content" as referred to in the present invention indicates a non-volatile matter from which a volatile component, such as an organic solvent, has been removed, and expresses a component remaining without being volatilized on drying the resin composition, and it also includes materials that are in a liquid form, a thick malt syrup-like form, or a waxy form at room temperature.

In the acrylic polymer (A), from the viewpoint of obtaining satisfactory properties in an acceleration test of insulation reliability, such as a pressure cooker bias test (PCBT), its alkali metal ion concentration is preferably 500 ppm or less, more preferably 200 ppm or less, and still more preferably 100 ppm or less on a mass basis.

The acrylic polymer (A) is in general obtained through radical polymerization using a radical polymerization initiator. Examples of the radical polymerization initiator include azobisisobutyronitrile (AIBN), tert-butyl perbenzoate, benzoyl peroxide, lauroyl peroxide, a persulfate, such as potassium persulfate, cumene hydroperoxide, t-butyl hydroperoxide, dicumyl peroxide, t-butyl peroxide, 2,2'-azobis-2,4-dimethylvaleronitrile, t-butyl perisobutyrate, t-butyl perpivalate, a hydrogen peroxide/ferrous salt, a persulfate/sodium acidic sulfite, a cumene hydroperoxide/ferrous salt, and benzoyl peroxide/dimethylaniline. These may be used alone or may be used in combination of two or more thereof.

Though the acrylic polymer (A) may be either powdery or liquid at room temperature (25° C.), it is preferably liquid from the viewpoint of excellent solubility in a solvent and dispersibility of the acrylic polymer (A) in the resin composition. From the viewpoint of enhancing the dispersibility of the acrylic polymer (A) in the resin composition, it is preferred to use the acrylic polymer (A) in a state where the aforementioned compound is dispersed in a solvent.

(Thermosetting Resin (B))

Though the thermosetting resin (B) is not particularly limited, examples thereof include an epoxy resin, a cyanate resin, a bismaleimide, an addition polymer of a bismaleimide and a diamine, a phenol resin, a resole resin, an isocyanate resin, a triallyl isocyanurate resin, a triallyl cyanurate resin, and a vinyl group-containing polyolefin compound. Of these, an epoxy resin (hereinafter also referred to as "epoxy resin (B-1)") and a cyanate resin are preferred from the viewpoint that they are excellent in a balance among performances, such as heat resistance, insulation properties, and high glass transition temperature. The thermosetting resin (B) may be used alone or may be used in combination of two or more thereof.

The epoxy resin (B-1) is preferably an epoxy resin having two or more epoxy groups in one molecule thereof.

As the epoxy resin (B-1), known materials can be used, and examples thereof include a bisphenol A type epoxy resin, a bisphenol F type epoxy resin, a bisphenol S type epoxy resin, a biphenyl type epoxy resin, a phenol novolak type epoxy resin, a cresol novolak type epoxy resin, a bisphenol A novolak type epoxy resin, a phosphorus-containing epoxy resin, a naphthalene skeleton-containing epoxy resin, an aralkylene skeleton-containing epoxy resin, a phenol biphenyl aralkyl type epoxy resin, a phenol salicyl aldehyde novolak type epoxy resin, a lower alkyl group-substituted phenol salicyl aldehyde novolak type epoxy resin, a dicyclopentadiene skeleton-containing epoxy resin, a polyfunctional glycidyl amine type epoxy resin, a polyfunctional alicyclic epoxy resin, and a tetrabromobisphenol A type epoxy resin. These may be used alone or may be used in combination of two or more thereof. Of these, from the viewpoint of compatibility with the acrylic polymer (A) on the occasion of solution formation, it is preferred that the epoxy resin (B-1) contains at least one bisphenol A type epoxy resin.

The epoxy resin (B-1) may be one which is commercially available as a marketed product, and examples thereof include "N770" (a trade name, manufactured by DIC Corporation) that is a phenol novolak type epoxy resin, "EPICLON 153" (a trade name, manufactured by DIC Corporation) that is a tetrabromobisphenol A type epoxy resin, "NC-3000-H" (a trade name, manufactured by Nippon Kayaku Co., Ltd.) that is biphenyl aralkyl type epoxy resin, "EPIKOTE 1001" (a trade name, manufactured by Mitsubishi Chemical Corporation) that is a bisphenol A type epoxy resin, "ZX-1548" (a trade name, manufactured by Tohto Kasei Co., Ltd.) that is a phosphorus-containing epoxy resin, and "EPICLON N-660" (a trade name, manufactured by DIC Corporation) that is a cresol novolak type epoxy resin.

A weight average molecular weight of the epoxy resin (B-1) is preferably 200 to 1,000, and more preferably 300 to 900. When the weight average molecular weight of the component (B-1) is 200 or more, a phase separation structure tends to be favorably formed, whereas when it is 1,000 or less, a phase separation structure in which the average domain size of the second phase is relatively small tends to be readily formed, and the low elasticity and the flexibility tend to be readily revealed.

From the viewpoint of compatibility, an epoxy equivalent of the epoxy resin (B-1) is preferably 150 to 500 g/eq, more preferably 150 to 450 g/eq, and still more preferably 150 to 300 g/eq.

An SP value of the epoxy resin (B-1) is preferably 9.0 to 15.0; more preferably 9.0 to 14.0 from the viewpoint of low moisture absorption; and still more preferably 9.5 to 14.0 from the viewpoint of heat resistance. When the SP value of the component (B-1) is 15.0 or less, on the occasion of solution formation, component separation tends to be hardly generated, whereas when it is 9.0 or more, the heat resistance tends to be improved. At this time, the SP value is a value determined with only the epoxy resin (B-1) regardless of the kind of curing agent, as mentioned previously.

As the cyanate resin which is used as the thermosetting resin (B), known materials can be used, and examples thereof include a novolak type cyanate resin, a bisphenol A type cyanate resin, a bisphenol E type cyanate resin, a bisphenol F cyanate resin, a tetramethyl bisphenol F type cyanate resin, and a dicyclopentadiene type cyanate resin. These may be used alone or may be used in combination of two or more thereof. Of these, from the viewpoint of compatibility with the acrylic polymer (A) on the occasion of solution formation, it is preferred that the cyanate resin contains at least one bisphenol A type cyanate resin.

In the case of using the cyanate resin as the thermosetting resin (B), a catalyst, a co-catalyst, or the like may be used in combination. Examples of the catalyst include imidazole-based curing agents, such as 2-phenyl-4-methylimidazole, 2-phenyl-4-methyl-5-hydroxymethylimidazole, 2-phenyl-4,5-dihydroxymethylimidazole, 2,4-diamino-6-(2'-undecylimidazoyl)-ethyl-s-triazine, and 2,4-diamino-6-[2'-ethyl-4-methylimidazolyl-(1')]-ethyl-s-triazine; and metal salts or metal complexes of cobalt, zinc, copper, iron, nickel, manganese, tin, etc. Examples of the catalyst include phenol-based compounds, such as an alkylphenol, a bisphenol compound, and a phenol novolak.

The thermosetting resin (B) may be used jointly with a curing agent, as the need arises. As the curing agent, known materials can be used.

In the case of using the epoxy resin (B-1) as the thermosetting resin (B), examples of the curing agent include phenol resins, such as a phenol novolak resin, a cresol novolak resin, a bisphenol A novolak resin, and a biphenyl novolak type phenol resin; amine-based curing agents, such as dicyandiamide, diaminodiphenylmethane, and diaminodiphenylsulfone; acid anhydride curing agents, such as pyromellitic anhydride, trimellitic anhydride, and benzophenone tetracarboxylic acid: and mixtures thereof.

In the resin composition of the present invention, it is preferred that not only the epoxy resin (B-1) is contained as the thermosetting resin (B), but also from the viewpoint of securing the adhesive strength to a metal foil, a phenol resin (B-2) is contained as the curing agent.

The phenol resin (B-2) may be one which is commercially available as a marketed product, and examples thereof include "KA-1165" (a trade name, manufactured by DIC Corporation) that is a cresol novolak type phenol resin and "MEH-7851" (a trade name, manufactured by Meiwa Plastic Industries, Ltd.) that is a biphenyl novolak type phenol resin.

The phenol resin (B-2) can be used in an arbitrary proportion according to the combination with the epoxy resin (B-1), and its blending ratio can be typically determined such that the glass transition temperature becomes high. Specifically, the content of the phenol resin (B-2) is preferably 0.5 to 1.5 equivalent, more preferably 0.6 to 1.3 equivalent, and still more preferably 0.7 to 1.2 equivalent relative to the epoxy resin (B-1). When the content of the phenol resin (B-2) falls within the aforementioned range, the adhesive properties to copper as an outer layer, the glass transition temperature, and insulation properties tend to be excellent.

The content of the thermosetting resin (B) in the resin composition of the present invention is preferably 15 to 80 parts by mass, more preferably 30 to 75 parts by mass, and still more preferably 35 to 70 parts by mass based on 100 parts by mass of the total solid content of the resin composition. When the content of the thermosetting resin (B) is 15 parts by mass or more, the high elasticity and the high strength that are excellent characteristic features of the thermosetting resin (B) tend to be satisfactorily obtained, whereas when it is 80 parts by mass or less, the low elasticity and the flexibility tend to be excellent.

The aforementioned content of the thermosetting resin (B) also includes the content of the curing agent, such as the phenol resin (B-2).

A mass ratio of the acrylic polymer (A) to the thermosetting resin (B) [acrylic polymer (A)/thermosetting resin (B)] in the resin composition of the present invention is preferably 10/90 to 90/10, more preferably 20/80 to 80/20, still more preferably 30/70 to 70/30, and especially preferably 40/60 to 60/40. When the mass ratio [acrylic polymer (A)/thermosetting resin (B)] falls within the aforementioned range, a phase separation structure in which the characteristic features of both of the acrylic polymer (A) and the thermosetting resin (B) are thoroughly revealed tends to be obtained.

(Curing Accelerator (C))

The resin composition of the present invention may contain a curing accelerator (C) according to the kind of the thermosetting resin (B).

In the case where the thermosetting resin (B) is the epoxy resin (B-1), though the curing accelerator (C) is not particularly limited, an amine or an imidazole is preferred. Examples of the amine include dicyandiamide, diaminodiphenylethane, and guanylurea. Examples of the imidazole include 2-phenylimidazole, 1-cyanoethyl-2-methylimidazole, 1-cyanoethyl-2-undecylimidazole, 1-cyanoethyl-2-phenylimidazole, 1-cyanoethyl-2-phenylimidazolium trimellitate, and benzoimidazole.

The content of the curing accelerator (C) in the resin composition of the present invention is preferably 0.01 to 10 parts by mass, more preferably 0.05 to 2 parts by mass, and still more preferably 0.07 to 0.5 parts by mass based on 100 parts by mass of the total solid content of the resin composition. In the case where the thermosetting resin (B) is the epoxy resin (B-1), the content of the curing accelerator (C) can be determined according to the whole amount of oxirane rings in the resin composition.

(Filler (D))

The resin composition of the present invention may contain a filler (D). Though the filler (D) is not particularly limited, an inorganic filler is preferred from the viewpoint of reducing a thermal expansion coefficient and securing flame retardancy. Examples of the inorganic filler include silica, alumina, titanium oxide, aluminum hydroxide, magnesium hydroxide, calcium carbonate, magnesium carbonate, calcium silicate, calcium oxide, magnesium oxide, aluminum nitride, aluminum borate whisker, boron nitride, and silicon carbide. These may be used alone or may be used in combination of two or more thereof. Of these, silica is preferred because of low dielectric constant, low linear expansion coefficient, etc. Examples of the silica include synthetic silica, crushed silica, and fused silica, all of which are synthesized by a wet method or a dry method.

An average particle diameter of the filler (D) is preferably 0.1 to 4.0 μm, more preferably 0.2 to 3.5 μm, and still more preferably 0.3 to 3.2 μm. When the average particle diameter is 0.1 μm or more, the filler (D) is readily dispersed, the viscosity of a varnish is lowered, and the handling properties become easy, and therefore, the workability tends to become good. In addition, when the average particle diameter is 4.0 μm or less, on the occasion of varnish formation, sedimentation of the filler (D) tends to be hardly generated.

Here, the average particle diameter in the present invention means a particle diameter which in determining a cumulative distribution curve by particle diameter while defining the total volume of particles as 100%, is corresponding to a point of 50% of the volume, and can be measured with a particle size distribution analyzer using the laser diffraction scattering method, or the like.

The filler (D) may also be a coupling-treated filler (D-1) (hereinafter also referred to as "component (D-1)"). As a coupling agent which is used for the aforementioned coupling treatment, a silane coupling agent is preferred. Examples of the silane coupling agent include an aminosilane-based coupling agent, an epoxysilane-based coupling agent, a phenylsilane-based coupling agent, an alkylsilane-based coupling agent, an alkenylsilane-based coupling agent, and an alkynylsilane-based coupling agent. These may be used alone or may be used in combination of two or more thereof.

In the case where the resin composition of the present invention contains the filler (D), it is more preferred that both of the component (D-1) and a non-coupling-treated filler (D-2) (hereinafter also referred to as "component (D-2)") are contained. According to this, the filler dispersibility in the resin composition can be controlled, and it becomes possible to thoroughly reveal the characteristic features of the component (A), the component (B), and the filler (D).

An average particle diameter of the component (D-1) is preferably 0.1 to 1.5 μm, more preferably 0.2 to 1.2 μm, and still more preferably 0.3 to 1.0 μm. When the average particle diameter of the component (D-1) is 0.1 μm or more, on the occasion of varnish formation, the filler is readily dispersed, and cohesion tends to be hardly generated, whereas when it is 1.5 μm or less, on the occasion of varnish formation, sedimentation of the filler (D) tends to be hardly generated.

An average particle diameter of the component (D-2) is preferably 1.0 to 3.5 μm, more preferably 1.2 to 3.2 μm, and still more preferably 1.4 to 3.0 μm. When the average particle diameter of the component (D-2) is 1.0 μm or more, the filler is readily dispersed, and cohesion tends to be hardly generated, whereas when it is 3.5 μm or less, on the occasion of varnish formation, sedimentation of the filler tends to be hardly generated.

In the case of using the component (D-1) and the component (D-2) in combination, a mass ratio thereof [(D-1)/(D-2)] is preferably 10/90 to 90/10, more preferably 20/80 to 80/20, and still more preferably 30/70 to 70/30. When the blending ratio falls within the aforementioned range, the characteristic features of both of the acrylic polymer (A) and the thermosetting resin (B) tend to be thoroughly revealed.

From the viewpoint of enhancing the dispersibility to homogenously reveal the addition effect of the filler, it is preferred that the filler (D) exists in all of the first phase and the second phase without being unevenly distributed in either one of the phases. In the composition of the resin composition of the present invention, a phase separation structure in which the filler (D) exists in all of the first phase and the second phase is obtained.

A cross-sectional SEM photograph of a cured material containing a filler as obtained from the resin composition of the present invention is shown in (a) and (b) of FIG. 13. In FIG. 13, (b) is an enlarged view of a region A in (a). It is noted from (a) and (b) of FIG. 13 that a phase separation structure in which a filler (D) 3 exists in a sea phase (acrylic polymer (A)) 1, a filler (D) 4 exists in an island phase (thermosetting resin (B)) 2, and the filler (D) exists in all of the first phase and the second phase, is obtained.

The content of the filler (D) in the resin composition of the present invention is preferably 5 to 40 parts by mass, more preferably 10 to 35 parts by mass, and still more preferably 15 to 30 parts by mass based on 100 parts by mass of the total solid content of the resin composition. When the content of the filler (D) is 5 parts by mass or more, there is a tendency that not only the coefficient of linear expansion becomes low, but also satisfactory heat resistance is obtained, whereas when it is 40 parts by mass or less, there is a tendency that the formation of a phase separation structure is not hindered by the filler (D), a cured material of the resin composition scarcely becomes brittle, and the low elasticity and the flexibility which the acrylic polymer (A) has are satisfactorily obtained.

(Other Components)

The resin composition of the present invention may contain a crosslinking agent, such as an isocyanate resin and a melamine resin; a flame retardant, such as a phosphorus-based compound; a rubber-based elastomer, a conductive particle, a coupling agent, a fluidity controlling agent, an antioxidant, a pigment, a levelling agent, a defoaming agent, an ion trapping agent, and so on, as the need arises. As these other components, known materials can be used.

The resin composition of the present invention may be a varnish-like resin composition dissolved and/or dispersed in an organic solvent (hereinafter also referred to simply as "varnish"). Examples of the organic solvent which is used for the varnish include ketone-based solvents, such as acetone, methyl ethyl ketone, methyl isobutyl ketone, and cyclohexanone; aromatic hydrocarbon-based solvents, such as toluene and xylene; ester-based solvents, such as methoxyethyl acetate, ethoxyethyl acetate, butoxyethyl acetate, and ethyl acetate; amide-based solvents, such as N-methylpyrrolidone, formamide, N-methyl formamide, and N,N-dimethyl acetamide; and alcohol-based solvents, such as methanol, ethanol, ethylene glycol, ethylene glycol monomethyl ether, ethylene glycol monoethyl ether, diethylene glycol, triethylene glycol monomethyl ether, triethylene glycol monoethyl ether, triethylene glycol, propylene glycol monomethyl ether, dipropylene glycol monomethyl ether, propylene glycol monopropyl ether, and dipropylene glycol monopropyl ether. These may be used alone or may be used in combination of two or more thereof.

A total solid concentration in the varnish is preferably 10 to 70% by mass, more preferably 20 to 60% by mass, and still more preferably 30 to 50% by mass.

<Phase Separation Structure>

The resin composition of the present invention forms a phase separation structure of a first phase containing the acrylic polymer (A) and a second phase containing the thermosetting resin (B).

The phase separation structure in the present invention is a sea-island structure, a continuous spherical structure, a composite dispersion phase structure, or a co-continuous phase structure. These phase separation structures are described in detail in, for example, Polymer Alloys, page 325 (1993), Tokyo Kagaku Dojin; and the continuous spherical structure is described in detail in, for example, Keizo Yamanaka and Takashi Iniue, POLYMER, Vol. 30, pp. 662 (1989).

FIGS. 1 to 4 show model views indicating a continuous spherical structure, a sea-island structure, a composite dispersion phase structure, and a co-continuous phase structure, respectively.

The resin composition of the present invention may form any structure of a continuous spherical structure, a sea-island structure, a composite dispersion phase structure, and a co-continuous phase structure. Of these, from the viewpoint of enhancing stress relaxation properties, it is preferred to form a sea-island structure.

In the case where a sea-island structure is formed from the resin composition of the invention of this application, the acrylic polymer (A) forms a sea phase, and the thermosetting resin (B) forms an island phase. It may be considered that a reason why the acrylic polymer (A) forms a sea phase but not an island phase resides in the following matter. That is, on the occasion when the phase separation of the thermosetting resin (B) occurs in the acrylic polymer (A) in which the molecular weight is large, and a plenty of entanglement is generated, the acrylic polymer (A) becomes an island phase, and therefore, its entanglement and crosslinking network, and the like must be cut, so that the acrylic polymer (A) hardly becomes the island phase.

An electron microscopic photograph indicating a cross-sectional structure of a resin composition having a sea-island structure obtained in a blending system from which the filler (D) is removed in a resin composition of Example 6 is shown in FIG. 5.

An electron microscopic photograph indicating a cross-sectional structure of a resin composition having a composite dispersion phase structure obtained in Example 6 is shown in FIG. 6.

Furthermore, in the aforementioned phase separation structure, the resin composition of the invention of this application is a resin composition forming a phase separation structure in which an average domain size of the second phase containing the thermosetting resin (B) is 20 μm or less.

By regulating the average domain size of the second phase to the aforementioned range, the characteristic features which the acrylic polymer (A) has, such as low elasticity, flexibility, and high elongation properties, can be conspicuously revealed; the characteristic features which the thermosetting resin (B) has, such as high elasticity and high strength, can be conspicuously revealed; or the both characteristic features can be revealed, as the need arises.

For example, when the average domain size of the second phase is 10 μm or less, the acrylic polymer (A) and the thermosetting resin (B) become a structure which is seemingly close to a compatible structure, and the thermosetting resin (B) is dispersed in a nano size in the network of the entangled acrylic polymer (A), and therefore, the characteristics of the acrylic polymer (A), such as low elasticity, flexibility, and high elongation properties, can be more conspicuously revealed. Furthermore, in view of the fact that the phase separation structure becomes complicated, the adhesive strength to a metal foil tends to become high, too.

When the average domain size of the second phase is 10 to 20 μm, not only the characteristics of the thermosetting resin (B), such as high elasticity and high strength, can be more conspicuously revealed, but also the low elasticity which the acrylic polymer (A) has can be revealed, an adhesive area to a metal foil is thoroughly obtained, and the adhesive strength to a metal foil tends to be excellent.

As mentioned above, though the average domain size of the second phase can be regulated according to the desired characteristics, from the viewpoint of revealing the characteristics originated from the acrylic polymer (A) and the characteristics originated from the thermosetting resin (B) in a good balance, the average domain size of the second phase may be 0.001 to 20 μm, may be 0.1 to 15 μm, or may be 1 to 10 μm.

For example, in the case where the phase separation structure is a continuous spherical structure, a sea-island structure, or a composite dispersion phase structure, the average domain size of the second phase can be measured by observing a cross-sectional structure of a cured material obtained from the resin composition of the present invention by a scanning electron microscope (SEM), measuring a maximum width of each of 100 domains of the second phase, and calculating an average value thereof. In addition, in the case where the phase separation structure is a co-continuous phase structure, a value obtained by specifying arbitrary 100 points in the domain of the second phase, measuring a domain size in the vertical direction and a domain size in the horizontal direction on the SEM photograph in each point, and calculating an average value of smaller domain sizes is defined as the average domain size. More specifically, the average domain size of the second phase can be measured by the method described in the section of Examples.

Whether or not the resin composition of the present invention forms the phase separation structure can also be confirmed by a method of measuring a loss factor tan δ regarding a cured material obtained from the resin composition of the present invention. Specifically, when the cured material obtained from the resin composition of the present invention is subjected to dynamic viscoelasticity measurement, and two peaks of a peak originated from the acrylic polymer (A) and a peak originated from the thermosetting resin (B) in the obtained loss factor tan δ curve appear, it can be judged that the phase separation structure is formed.

Curves of loss factor tan δ of resin compositions obtained in Examples 2, 7, and 12 are shown in FIGS. 10 to 12, respectively. In FIGS. 10 to 12, a peak in the vicinity of 30 to 70° C. is a peak originated from the acrylic polymer (A), and a peak in the vicinity of 150 to 200° C. is a peak originated from the thermosetting resin (B). In view of the existence of these peaks, it is noted that the resin composition forms a phase separation structure.

In view of the fact that a domain having an average domain size of more than 20 μm can be confirmed through SEM observation, in the case where not only the phase separation structure is not confirmed through the aforementioned SEM observation, but also two peaks in the curve of loss factor tan δ are confirmed as mentioned above, it can be judged that the second phase having an average domain size of 20 μm or less is formed.

The tan δ curve can be measured in more detail by the method described in the section of Examples.

Such a fine phase separation structure is obtained by controlling the catalyst species of the resin composition, a curing condition, such as a reaction temperature, or compatibility among the components of the resin composition. In order to make it easy to generate the phase separation, such can be, for example, achieved by lowering the compatibility with the acrylic polymer (A) by using an alkyl group-substituted epoxy resin, or in the case of the identical composition system, increasing the curing temperature or delaying the curing rate through selection of the catalyst species.

An electron microscopic photograph indicating a cross-sectional structure as one example of the thus obtained resin composition having a sea-island structure is shown in FIGS. 7, 8, and 9 (corresponding respectively to Examples 2, 7, and 12). As shown in each figure, by controlling the SP value of each of the components, the resin composition has a sea-island structure composed of a sea phase containing the acrylic polymer (A) and an island phase containing the epoxy resin (B-1), and the average domain size of the island phase is controlled to 20 μm or less.

In the case where the resin composition of the present invention does not contain the filler (D), a sea-island structure or a continuous spherical structure is formed, whereas in the case where it contains the filler (D), a fine co-continuous phase structure or a composite dispersion phase structure may be formed.

(Storage Elastic Modulus)

From the viewpoint of revealing a stress relaxation effect, a storage elastic modulus of a cured material obtained from the resin composition of the present invention is preferably $2.0 \times 10^9$ Pa or less, more preferably $1.9 \times 10^9$ Pa or less, and still more preferably $1.8 \times 10^9$ Pa or less. The storage elastic modulus can be allowed to fall within the aforementioned range by, for example, regulating the content of the filler (D). From such a viewpoint, it is preferred that the content of the filler (D) falls within the aforementioned range. In addition, the storage elastic modulus of the cured material can be measured by the method described in the section of Examples.

[Production Method of Resin Composition]

The resin composition of the present invention can be, for example, produced by a production including the following Steps 1 to 4:

Step 1: a step of determining physical properties of a cured material of a desired resin composition;

Step 2: a step of specifying an absolute value X of a difference between a solubility parameter (SP value) of the acrylic polymer (A) and a solubility parameter (SP value) of the thermosetting resin (B) on a basis of a correlation between the absolute value X and the physical properties of the cured material;

Step 3: a step of selecting the acrylic polymer (A) and the thermosetting resin (B) so as to take the absolute value X as specified in the Step 2; and Step 4: a step of mixing the acrylic polymer (A) and the thermosetting resin (B) as selected in the Step 3.

Examples of the physical properties of the cured material in the Step 1 include storage elastic modulus, thermal expansion properties, flexibility, high elongation properties, heat resistance, mechanical strength, adhesive properties to a metal foil, and insulation reliability. It is preferred to determine a value of elastic modulus (low elasticity) that is a representative characteristic feature of the acrylic polymer (A), or a value of heat resistance that is a representative characteristic feature of the thermosetting resin (B), in the Step 1.

In the Step 2, an absolute value X of a difference between a solubility parameter (SP value) of the acrylic polymer (A) and a solubility parameter (SP value) of the thermosetting resin (B) on a basis of a correlation between the absolute value X and the physical properties (for example, storage elastic modulus and heat resistance) of the cured material is specified. Here, as the absolute value X is smaller, the phase separation rate becomes slower, whereby a cured material with high compatibility between the acrylic polymer (A) and the thermosetting resin (B) is provided. As a result, the low elasticity that is a characteristic feature of the acrylic polymer (A) tends to be obtained. On the other hand, as the absolute value X is larger, the phase separation rate becomes faster, whereby a cured material with conspicuous phase separation between the acrylic polymer (A) and the thermosetting resin (B) is provided. As a result, a cured material with excellent heat resistance and mechanical strength that are characteristic features of the thermosetting resin (B) tends to be obtained.

The correlation between the absolute value X and the physical properties of the cured material can be determined by acquiring the absolute value X and the physical properties of the cured material in plural compositions in advance.

In the Step 3, the acrylic polymer (A) and the thermosetting resin (B) so as to take the absolute value X as specified in the Step 2 are selected. The SP values of the acrylic polymer (A) and the thermosetting resin (B) can be calculated by the aforementioned Fedors method or the like, and therefore, the structures of the acrylic polymer (A) and the thermosetting resin (B) may be determined so as to take the absolute value X to be determined.

In the Step 4, the acrylic polymer (A) and the thermosetting resin (B) as selected in the Step 3 are mixed. As for the mixing method, a conventionally known stirrer or the like can be applied.

[Prepeg]

A prepreg of the present invention is one prepared by impregnating a base material with the resin composition of the present invention and then drying. The prepreg can be, for example, produced by impregnating a base material with the varnish-like resin composition of the present invention and then drying.

In general, fibrous base materials, such as a woven fabric and a non-woven fabric, are used as the base material. Examples of a material of the fibrous base material include inorganic fibers, such as glass, alumina, asbestos, boron, silica alumina glass, silica glass, Tyranno, silicon carbide, silicon nitride, and zirconia; organic fibers, such as aramid, polyetheretherketone, polyether imide, polyether sulfone, carbon, and cellulose; and mixed systems thereof.

A thickness of the base material is preferably 10 to 100 µm, and more preferably 20 to 50 µm. By using a base material having a thickness of 50 µm or less, an arbitrarily foldable printed wiring board can be obtained, and a dimensional change following the temperature, the moisture absorption, or the like on a production process can be minimized.

Though a production condition of the prepreg is not particularly limited, it is preferred that in the resulting prepreg, the organic solvent used for the varnish volatilizes to an extent of 80% by mass or more. A drying temperature is, for example, 80 to 180° C., and a drying time is properly set in connection with a gelation time of the varnish. In addition, the impregnation amount of the varnish is preferably an amount at which the solid content of the resin composition of the present invention in the resulting prepreg is 30 to 80% by mass.

[Resin Coated Metal Foil]

A resin coated metal foil of the present invention is one prepared by laminating the resin composition of the present invention and a metal foil. The resin coated metal foil can be, for example, produced by coating the resin composition of the present invention on a metal foil and then drying. As for a drying condition, for example, the production can be performed through drying at 80 to 180° C.

[Laminate Plate]

A laminate plate of the present invention is a laminate plate prepared by laminating the prepreg of the present invention or the resin coated metal foil of the present invention and then heating and pressurizing. The laminate plate having a metal foil arranged therein is sometimes referred to as "metal clad laminate plate".

The metal clad laminate plate can be, for example, produced by superimposing a metal foil on adhesive surfaces of both sides of a laminate plate prepared by laminating a plurality of the prepregs of the present invention so as to unite them, followed by performing heat pressure molding at typically 130 to 250° C., and preferably 150 to 230° C. under a pressure of 0.5 to 10 MPa, and preferably 1 to 5 MPa. As another production method of a metal clad laminate plate, the metal clad laminate plate can be produced by superimposing two sheets of the resin coated metal foil of the present invention such that the resin surfaces thereof face each other, followed by pressing in a vacuum press. As for the heating and pressurizing, for example, a multi-stage press, a multi-stage vacuum press, a continuous molding machine, an autoclave molding machine, and so on can be used.

As the metal foil which is used for the metal clad laminate plate, for example, a copper foil, an aluminum foil, and so on are generally used. A thickness of the metal foil is, for example, 1 to 200 µm, the thickness of which is generally adopted for laminate plates. Besides, a composite foil of a three-layer structure in which a copper layer of 0.5 to 15 µm and a copper layer of 10 to 300 µm are provided on both surfaces of an intermediate layer made of, for example, nickel, a nickel-phosphorus, a nickel-tin alloy, a nickel-iron alloy, lead, a lead-tin alloy, etc.; a composite foil of a two-layer structure in which aluminum and a copper foil are composited; and so on can be used.

[Printed Wiring Board]

A printed wiring board of the present invention is one prepared by subjecting the laminate plate of the present invention to circuit processing. The printed wiring board of the present invention can be produced by subjecting the metal foil of the laminate plate of the present invention having a metal foil on one surface or both surfaces thereof (metal clad laminate plate) to circuit (wiring) processing.

Furthermore, a semiconductor package can also be produced by mounting a semiconductor on the printed wiring board of the present invention. The semiconductor package can be produced by mounting a semiconductor chip, a memory, and so on at predetermined positions of the printed wiring board of the present invention.

EXAMPLES

The present invention is hereunder specifically described by reference to Examples, but it should be construed that the present invention is not limited by these Examples.

[Production Acrylic Polymer]

Production Example 1

(Synthesis of Acrylic Polymer A)

In an autoclave equipped with a stirrer and a condenser, 35.0 parts by mass of 2-ethylhexyl methacrylate (2-EHMA), 60.0 parts by mass of n-butyl methacrylate (n-BMA), and 5.0 parts by mass of glycidyl methacrylate (GMA) were charged as monomers; a suspending agent and ion-exchanged water were added and stirred; and the contents were polymerized at 65° C. for 2 hours and then at 105° C. for 2 hours under a nitrogen atmosphere, thereby obtaining resin particles. The resin particles were washed with water, dehydrated, and dried, and then dissolved in methyl ethyl ketone such that a heating residue was 30% by mass, thereby obtaining a solution of Acrylic Polymer A. An SP value of the Acrylic Polymer A was 9.45.

Production Example 2

(Synthesis of Acrylic Polymers B to G)

Solutions of Acrylic Polymers B to G were obtained in the same manner as in Production Example 1, except that in Production Example 1, the monomer composition ratio was changed to one in the "monomer composition ratio" in Tables 2 to 4. SP values of Acrylic Polymers B to G are shown in Tables 2 to 4.

[Production of Resin Composition]

Example 1

Among the components shown in Table 2, the components other than the component (C) were blended in blending amounts shown in Table 2 (the numerical values in the table are parts by mass of a solid content, and in the case of a solution or a dispersion liquid, are an amount expressed in terms of solid content), dissolved in methyl isobutyl ketone, and then blended with 2-phenylimidazole as the component (C) in a blending amount shown in Table 2, thereby obtaining a varnish having an insoluble matter content (solid concentration) of 40% by mass.

Examples 2 to 37 and Comparative Examples 1 to 10

Varnishes were obtained in the same manner as in Example 1, except that in Example 1, the blending composition was changed as shown in Tables 2 to 6.

[Preparation of Prepreg]

With the varnish prepared in each of the Examples, Glass Cloth 1037 (a product name, manufactured by Asahi-Schwebel Co., Ltd.) having a thickness of 0.028 mm was impregnated and then heated for drying at 140° C. for 10 minutes, thereby obtaining a prepreg.

[Preparation of Resin Coated Copper Foil]

The varnish prepared in each of the Examples was coated on an electrolytic copper foil YGP-18 (a trade name, manufactured by Nippon Denkai, Ltd.) having a thickness of 18 μm by using a coater and then subjected to hot-air drying at 140° C. for about 6 minutes, thereby preparing a resin coated copper foil in which a thickness of the resin composition layer was 50 μm.

[Preparation of Copper Clad Laminate Plate]

On both sides of four sheets of the prepreg as superimposed, an electrolytic copper foil YGP-18 (a trade name, manufactured by Nippon Denkai, Ltd.) having a thickness of 18 μm was superimposed such that its adhesive surface faced the prepreg and then subjected to vacuum pressing at 200° C. under a condition at 4 MPa for 60 minutes, thereby preparing a double-sided copper clad laminate plate. In addition, two sheets of the resin coated copper foil were superimposed such that the resin surfaces faced each other and subjected to vacuum pressing at 200° C. under a condition at 4 MPa for 60 minutes, thereby preparing a double-side copper clad laminate plate.

[Evaluation Methods]
(1) Varnish Properties (Compatibility of Components)

As for the evaluation of varnish properties (compatibility of components), the prepared varnish was received in a transparent vessel, and the appearance after elapsing 24 hours was observed through visual inspection, thereby observing separation of the components in the varnish and a sediment.

In the case where a hue of the varnish was uniform, it was judged that no separation is generated, and in the case where unevenness was confirmed in the hue, it was judged that the separation is generated.

In the case where accumulation of a sediment could not be confirmed through visual inspection, it was judged that no sediment is formed, and in the case where the accumulation was confirmed through visual inspection, it was judged that the sediment is formed. The results are shown in Tables 2 to 6. In Tables 2 to 6, the case where neither separation of the components nor sedimentation was observed is expressed as "No".

(2) Varnish Properties (Viscosity)

As for the evaluation of varnish properties (viscosity), the prepared varnish was put into a cup, a varnish temperature was regulated to 30° C. by using a water bath, and thereafter, the viscosity was calculated with a BL type viscometer (manufactured by Toki Sangyo Co., Ltd.). In the case where the viscosity at 30° C. was 800 mPa·s or less, it was judged that there is no problem in production of a prepreg. The results are shown in Tables 2 to 6.

(3) Tackiness of Prepreg (Presence or Absence of Generation of Adhesion)

As for the evaluation of tackiness of the prepreg, ten sheets of the prepared prepreg which had been processed into a size of 250 mm×250 mm were superimposed and put into a hermetically sealable bag, which was then charged in a constant-temperature and constant-humidity environment at a temperature of 25° C. and a humidity of 70%, and the presence or absence of generation of adhesion between the prepregs to each other was observed. After elapsing 48 hours, in the case where the prepreg arranged in the bottom and the prepreg adjacent thereto were separated from each other, and each of these prepregs kept the surface before being charged, it was judged that the adhesion is not generated ("No"), and there was no problem regarding the tackiness. The results are shown in Tables 2 to 6.

(4) Appearance of Prepreg (Presence or Absence of Agglomerate)

As for the evaluation of appearance of prepreg (presence or absence of agglomerate), the generation of an agglomerate was observed using a magnifying glass of 20 times magnification. The prepreg in which no agglomerate was observed is expressed as "No". The results are shown in Tables 2 to 6.

(5) Storage Elastic Modulus at 25° C.

As for the evaluation of storage elastic modulus, a laminate plate resulting from overall etching of the double-sided copper clad laminate plate prepared from the resin coated copper foil was cut in a size of 5 mm in width×30 mm in length, and its storage elastic modulus was calculated with a dynamic viscoelasticity measuring device (manufactured by UBM Co., Ltd.). In the case where the storage elastic modulus at 25° C. was $2.0 \times 10^9$ Pa or less, it was judged that it is possible to reveal a stress relaxation effect. In addition, in order to calculate a loss factor tan δ, a loss modulus was calculated in the same manner as in the storage elastic modulus. The results are shown in Tables 2 to 6.

The loss factor tan δ is a ratio of a loss modulus (Pa) to the storage elastic modulus (Pa) (namely, (loss factor tan δ)=(loss modulus)/(storage elastic modulus)).

(6) Tensile Strength

As for the evaluation of tensile strength, a laminate plate resulting from overall etching of the double-sided copper clad laminate plate prepared from the resin coated copper foil was cut in a size of 10 mm in width×100 mm in length, and its tensile strength was calculated with an autograph (manufactured by Shimadzu Corporation). In the case where the tensile strength at 25° C. was $10 \times 10^9$ Pa or more, it was judged that the strength is satisfactory. The results are shown in Tables 2 to 6.

(7) Tensile Elongation Percentage

As for the evaluation of tensile elongation percentage, a laminate plate resulting from overall etching of the double-sided copper clad laminate plate prepared from the resin coated copper foil was cut in a size of 10 mm in width×100 mm in length, and its tensile elongation percentage was calculated with an autograph (manufactured by Shimadzu Corporation). In the case where the tensile elongation percentage at 25° C. was 2.4% or more, it was judged that it is possible to reveal a stress relaxation effect. The results are shown in Tables 2 to 6.

(8) Heat Resistance

As for the evaluation of heat resistance, the double-sided copper clad laminate plate prepared from the prepreg was cut out into a regular square of 50 mm in square, thereby obtaining a test piece. The test piece was floated in a solder bath at 260° C., and an elapsed time from that point until swelling of the test piece was perceived through visual inspection was measured. The elapsed time was set to up to 300 seconds, and in the case where the elapsed time was 250 seconds or longer, it was judged that the heat resistance is satisfactory. The results are shown in Tables 2 to 6.

(9) Copper Foil Peeling Strength

As for the evaluation of metal foil adhesive properties to a substrate, the copper foil of the double-sided copper clad laminate plate prepared from the prepreg was partially etched to form copper foil lines with a width of 3 mm. Subsequently, a load on peeling the copper foil lines in the 90° direction against the adhesive surface at a rate of 50 mm/min was measured and defined as the copper foil peeling strength. In the case where the copper foil peeling strength was 0.5 kN/m or more, it was judged that the adhesive properties to the metal foil are satisfactory. The results are shown in Tables 2 to 6.

(10) Phase Structure Observation Test

In the phase structure observation, a cross section of the resin insulating layer of the double-sided copper clad laminate plate prepared from the resin coated copper foil was smoothened with a microtome and then lightly etched with a persulfate solution; the resultant was subjected to SEM observation; a maximum width of each of 100 domains of an island phase of a fine phase separation structure was measured; and an average value thereof was calculated. The results are shown in Tables 2 to 6.

(11) Electric Insulation Reliability

As for the electric insulation reliability, each of the double-sided copper clad laminate plates prepared by the prepreg was processed into a test pattern having through holes with a wall-to-wall distance of 350 μm, and the insulation resistance between 400 through holes were then measured with time. The test was performed by applying 100 V in an atmosphere of 85° C. and 85% RH, and the time until the occurrence of continuity breakdown was measured. The measurement time was set to up to 2,000 hours, and in the case where the measurement time was 2,000 hours or longer, it was judged that the electric insulation reliability is satisfactory. The results are shown in Tables 2 to 6.

TABLE 2

| | | | | | Example | | | | |
|---|---|---|---|---|---|---|---|---|---|
| | | | Item | | 1 | 2 | 3 | 4 | 5 |
| Blending composition (parts by mass) | Component (A) | Kind of acrylic polymer | | | A | B | C | D | E |
| | | Blending amount of acrylic polymer | | | 35.0 | 35.0 | 35.0 | 35.0 | 35.0 |
| | | Monomer composition ratio | EA (Ethyl acrylate) | | | | | 30.0 | 55.0 |
| | | | MMA (Methyl methacrylate) | | | | | 36.0 | |
| | | | BA (n-Butyl acrylate) | | | | 60.0 | 30.0 | |
| | | | EHMA (2-Ethylhexyl methacrylate) | | 35.0 | | | | |
| | | | n-BMA (n-Butyl methacrylate) | | 60.0 | 60.0 | | | |
| | | | FA-513AS (Tricydo[5.2.1.0(2,6)]deca-8-yl acrylate) | | | 35.0 | 35.0 | | |
| | | | DMMA (Dimethyl acrylamide) | | | | | | 41.0 |
| | | | GMA (Glycidyl methacrylate) | | 5.0 | 5.0 | 5.0 | 4.0 | 4.0 |
| | | | AA (Acrylic acid) | | | | | | |
| | | | Total | | 100.0 | 100.0 | 100.0 | 100.0 | 100.0 |
| | Component (B) | Component (B-1) | NC-3000-H | | | | | | |
| | | | EPICLON 153 | | 30.0 | 30.0 | 30.0 | 30.0 | 30.0 |
| | | | N770 | | | | | | |
| | | | HP-7200 | | | | | | |
| | | | FX-305 | | | | | | |
| | | Component (B-2) | KA-1165 | | 10.0 | 10.0 | 10.0 | 10.0 | 10.0 |
| | Component (C) | | 2-Phenylimidazole | | 0.1 | 0.1 | 0.1 | 0.1 | 0.1 |
| | Component (D) | | F05-12 | | 25.0 | 25.0 | 25.0 | 25.0 | 25.0 |
| | Coupling agent | | A-187 | | 0.1 | 0.1 | 0.1 | 0.1 | 0.1 |

TABLE 2-continued

| | | Example | | | | |
|---|---|---|---|---|---|---|
| | Item | 1 | 2 | 3 | 4 | 5 |
| SP value | Component (A) | 9.45 | 9.68 | 9.83 | 10.05 | 11.4 |
| | Component (B) | 14.15 | 14.15 | 14.15 | 14.15 | 14.15 |
| | Absolute value of difference between component (A) and component (B) | 4.70 | 4.47 | 4.32 | 4.10 | 2.75 |
| Evaluation results | Varnish properties (compatibility of components) | No | No | No | No | No |
| | Varnish properties (viscosity) (mPa · s) | 341 | 365 | 372 | 338 | 397 |
| | Tackiness of prepreg (presence or absence of generation of adhesion) | No | No | No | No | No |
| | Appearance of prepreg (presence or absence of agglomerate) | No | No | No | No | No |
| | Storage elastic modulus at 25° C. (Pa) | $1.8 \times 10^9$ | $1.6 \times 10^9$ | $1.5 \times 10^9$ | $1.3 \times 10^9$ | $1.0 \times 10^9$ |
| | Tensile strength (Pa) | $25.8 \times 10^9$ | $23.2 \times 10^9$ | $22.9 \times 10^9$ | $21.1 \times 10^9$ | $17.9 \times 10^9$ |
| | Tensile elongation percentage (%) | 3.3 | 3.6 | 4.2 | 5.7 | 6.9 |
| | Heat resistance (sec) | >300 | >300 | >300 | >300 | >300 |
| | Copper foil peeling strength (kN/m) | 0.71 | 0.73 | 0.79 | 0.81 | 0.85 |
| | Phase structure - Average domain size of island phase (μm) | 19.2 | 17.8 | 14.9 | 12.3 | 9.76 |
| | Electric insulation reliability (hr) | >2000 | >2000 | >2000 | >2000 | >2000 |

TABLE 3

| | | | | Example | | | | |
|---|---|---|---|---|---|---|---|---|
| | | Item | | 6 | 7 | 8 | 9 | 10 |
| Blending composition (parts by mass) | Component (A) | Kind of acrylic polymer | | A | C | E | A | C |
| | | Blending amount of acrylic polymer | | 35.0 | 35.0 | 35.0 | 35.0 | 35.0 |
| | | Monomer composition ratio | EA (Ethyl acrylate) | | | 55.0 | | |
| | | | MMA (Methyl methacrylate) | | | | | |
| | | | BA (n-Butyl acrylate) | | 60.0 | | | 60.0 |
| | | | EHMA (2-Ethylhexyl methacrylate) | 35.0 | | | 35.0 | |
| | | | n-BMA (n-Butyl methacrylate) | 60.0 | | | 60.0 | |
| | | | FA-513AS (Tricyclo[5.2.1.0(2,6)]deca-8-yl acrylate) | | 35.0 | | | 35.0 |
| | | | DMMA (Dimethyl acrylamide) | | | 41.0 | | |
| | | | GMA (Glycidyl methacrylate) | 5.0 | 5.0 | 4.0 | 5.0 | 5.0 |
| | | | AA (Acrylic acid) | | | | | |
| | | | Total | 100.0 | 100.0 | 100.0 | 100.0 | 100.0 |
| | Component (B) | Component (B-1) | NC-3000-H | 30.0 | 30.0 | 30.0 | | |
| | | | EPICLON 153 | | | | | |
| | | | N770 | | | | 30.0 | 30.0 |
| | | | HP-7200 | | | | | |
| | | | FX-305 | | | | | |
| | | Component (B-2) | KA-1165 | 10.0 | 10.0 | 10.0 | 10.0 | 10.0 |
| | Component (C) | | 2-Phenylimidazole | 0.1 | 0.1 | 0.1 | 0.1 | 0.1 |
| | Component (D) | | F05-12 | 25.0 | 25.0 | 25.0 | 25.0 | 25.0 |
| | Coupling agent | | A-187 | 0.1 | 0.1 | 0.1 | 0.1 | 0.1 |
| SP value | Component (A) | | | 9.45 | 9.83 | 11.40 | 9.45 | 9.83 |
| | Component (B) | | | 10.99 | 10.99 | 10.99 | 10.55 | 10.55 |
| | Absolute value of difference between component (A) and component (B) | | | 1.54 | 1.16 | 0.41 | 1.10 | 0.72 |
| Evaluation results | Varnish properties (compatibility of components) | | | No | No | No | No | No |
| | Varnish properties (viscosity) (mPa · s) | | | 312 | 349 | 331 | 398 | 377 |
| | Tackiness of prepreg (presence or absence of generation of adhesion) | | | No | No | No | No | No |
| | Appearance of prepreg (presence or absence of agglomerate) | | | No | No | No | No | No |
| | Storage elastic modulus at 25° C. (Pa) | | | $1.7 \times 10^9$ | $1.2 \times 10^9$ | $0.8 \times 10^9$ | $0.9 \times 10^9$ | $0.5 \times 10^9$ |
| | Tensile strength (Pa) | | | $28.6 \times 10^9$ | $25.0 \times 10^9$ | $19.9 \times 10^9$ | $13.3 \times 10^9$ | $10.6 \times 10^9$ |
| | Tensile elongation percentage (%) | | | 4.4 | 5.2 | 7.7 | 6.4 | 8.1 |
| | Heat resistance (sec) | | | >300 | >300 | >300 | >300 | >300 |

TABLE 3-continued

| | | | | | | |
|---|---|---|---|---|---|---|
| Copper foil peeling strength (kN/m) | | 0.74 | 0.76 | 0.88 | 0.87 | 0.92 |
| Phase structure - Average domain size of island phase (μm) | | 4.78 | 3.99 | <1.00 | 4.82 | 1.74 |
| Electric insulation reliability (hr) | | >2000 | >2000 | >2000 | >2000 | >2000 |

| | | | | Example | | | |
|---|---|---|---|---|---|---|---|
| | | | Item | 11 | 12 | 13 | 14 |
| Blending composition (parts by mass) | Component (A) | Kind of acrylic polymer | | E | A | C | E |
| | | Blending amount of acrylic polymer | | 35.0 | 35.0 | 35.0 | 35.0 |
| | | Monomer composition ratio | EA (Ethyl acrylate) | 55.0 | | | 55.0 |
| | | | MMA (Methyl methacrylate) | | | | |
| | | | BA (n-Butyl acrylate) | | | 60.0 | |
| | | | EHMA (2-Ethylhexyl methacrylate) | | 35.0 | | |
| | | | n-BMA (n-Butyl methacrylate) | | 60.0 | | |
| | | | FA-513AS (Tricyclo[5.2.1.0(2,6)]deca-8-yl acrylate) | | | 35.0 | |
| | | | DMMA (Dimethyl acrylamide) | 41.0 | | | 41.0 |
| | | | GMA (Glycidyl methacrylate) | 4.0 | 5.0 | 5.0 | 4.0 |
| | | | AA (Acrylic acid) | | | | |
| | | | Total | 100.0 | 100.0 | 100.0 | 100.0 |
| | Component (B) | Component (B-1) | NC-3000-H | | | | |
| | | | EPICLON 153 | | | | |
| | | | N770 | 30.0 | | | |
| | | | HP-7200 | | 30.0 | 30.0 | 30.0 |
| | | | FX-305 | | | | |
| | | Component (B-2) | KA-1165 | 10.0 | 10.0 | 10.0 | 10.0 |
| | Component (C) | | 2-Phenylimidazole | 0.1 | 0.1 | 0.1 | 0.1 |
| | Component (D) | | F05-12 | 25.0 | 25.0 | 25.0 | 25.0 |
| | Coupling agent | | A-187 | 0.1 | 0.1 | 0.1 | 0.1 |
| SP value | Component (A) | | | 11.40 | 9.45 | 9.83 | 11.40 |
| | Component (B) | | | 10.55 | 9.69 | 9.69 | 9.69 |
| | Absolute value of difference between component (A) and component (B) | | | 0.85 | 0.24 | 0.14 | 1.71 |
| Evaluation results | Varnish properties (compatibility of components) | | | No | No | No | No |
| | Varnish properties (viscosity) (mPa · s) | | | 406 | 415 | 381 | 403 |
| | Tackiness of prepreg (presence or absence of generation of adhesion) | | | No | No | No | No |
| | Appearance of prepreg (presence or absence of agglomerate) | | | No | No | No | No |
| | Storage elastic modulus at 25° C. (Pa) | | | $0.8 \times 10^9$ | $0.9 \times 10^9$ | $0.9 \times 10^9$ | $1.5 \times 10^9$ |
| | Tensile strength (Pa) | | | $11.7 \times 10^9$ | $18.7 \times 10^9$ | $17.9 \times 10^9$ | $25.9 \times 10^9$ |
| | Tensile elongation percentage (%) | | | 6.5 | 5.3 | 5.9 | 3.8 |
| | Heat resistance (sec) | | | >300 | >300 | >300 | >300 |
| | Copper foil peeling strength (kN/m) | | | 0.89 | 0.72 | 0.75 | 0.65 |
| | Phase structure - Average domain size of island phase (μm) | | | 2.01 | <1.00 | <1.00 | 6.69 |
| | Electric insulation reliability (hr) | | | >2000 | >2000 | >2000 | >2000 |

TABLE 4

| | | | | Comparative Example | | | | |
|---|---|---|---|---|---|---|---|---|
| | | | Item | 1 | 2 | 3 | 4 | 5 |
| Blending composition (parts by mass) | Component (A) | Kind of acrylic polymer | | F | F | F | F | G |
| | | Blending amount of acrylic polymer | | 35.0 | 35.0 | 35.0 | 35.0 | 35.0 |
| | | Monomer composition ratio | EA (Ethyl acrylate) | | | | | |
| | | | MMA (Methyl methacrylate) | | | | | |
| | | | BA (n-Butyl acrylate) | | | | | |
| | | | EHMA (2-Ethylhexyl methacrylate) | | | | | |

TABLE 4-continued

|  |  |  |  |  |  |  |  |
|---|---|---|---|---|---|---|---|
|  |  |  | n-BMA (n-Butyl methacrylate) |  |  |  |  |
|  |  |  | FA-513AS (Tricyclo[5.2.1.0(2,6)]deca-8-yl acrylate) |  |  |  |  |
|  |  |  | DMMA (Dimethyl acrylamide) | 95.5 | 95.5 | 95.5 | 95.5 |  |
|  |  |  | GMA (Glycidyl methacrylate) | 5.0 | 5.0 | 5.0 | 5.0 | 5.0 |
|  |  |  | AA (Acrylic acid) |  |  |  |  | 95.5 |
|  |  |  | Total | 100.0 | 100.0 | 100.0 | 100.0 | 100.0 |
|  | Component (B) | Component (B-1) | NC-3000-H |  | 30.0 |  |  |  |
|  |  |  | EPICLON 153 | 30.0 |  |  |  | 30.0 |
|  |  |  | N770 |  |  | 30.0 |  |  |
|  |  |  | HP-7200 |  |  |  | 30.0 |  |
|  |  |  | FX-305 |  |  |  |  |  |
|  |  | Component (B-2) | KA-1165 | 10.0 | 10.0 | 10.0 | 10.0 | 10.0 |
|  | Component (C) |  | 2-Phenylimidazole | 0.1 | 0.1 | 0.1 | 0.1 | 0.1 |
|  | Component (D) |  | F05-12 | 25.0 | 25.0 | 25.0 | 25.0 | 25.0 |
|  | Coupling agent |  | A-187 | 0.1 | 0.1 | 0.1 | 0.1 | 0.1 |
| SP value | Component (A) |  |  | 12.10 | 12.10 | 12.10 | 12.10 | 12.30 |
|  | Component (B) |  |  | 14.15 | 10.99 | 10.55 | 9.69 | 14.15 |
|  | Absolute value of difference between component (A) and component (B) |  |  | 2.05 | 1.11 | 1.55 | 2.41 | 1.85 |
| Evaluation results | Varnish properties (compatibility of components) |  |  | No | No | No | No | No |
|  | Varnish properties (viscosity) (mPa · s) |  |  | 611 | 527 | 677 | 492 | 594 |
|  | Tackiness of prepreg (presence or absence of generation of adhesion) |  |  | No | No | No | No | Yes |
|  | Appearance of prepreg (presence or absence of agglomerate) |  |  | No | No | No | No | Yes |
|  | Storage elastic modulus at 25° C. (Pa) |  |  | $0.7 \times 10^9$ | $0.9 \times 10^9$ | $0.4 \times 10^9$ | $1.0 \times 10^9$ | $0.6 \times 10^9$ |
|  | Tensile strength (Pa) |  |  | $22.9 \times 10^9$ | $19.7 \times 10^9$ | $13.2 \times 10^9$ | $16.5 \times 10^9$ | $17.6 \times 10^9$ |
|  | Tensile elongation percentage (%) |  |  | 2.1 | 2.3 | 2.8 | 1.9 | 3.1 |
|  | Heat resistance (sec) |  |  | >300 | >300 | >300 | >300 | 170 |
|  | Copper foil peeling strength (kN/m) |  |  | 0.59 | 0.61 | 0.63 | 0.51 | 0.60 |
|  | Phase structure - Average domain size of island phase (μm) |  |  | 24.8 | 21.1 | 26.3 | 24.7 | 25.4 |
|  | Electric insulation reliability (hr) |  |  | 450 | 900 | 450 | 1100 | 900 |

|  |  |  |  | Comparative Example |  |  |  |  |
|---|---|---|---|---|---|---|---|---|
|  |  | Item |  | 6 | 7 | 8 | 9 | 10 |
| Blending composition (parts by mass) | Component (A) | Kind of acrylic polymer |  | G | G | G | C | D |
|  |  | Blending amount of acrylic polymer |  | 35.0 | 35.0 | 35.0 | 35.0 | 35.0 |
|  |  | Monomer composition ratio | EA (Ethyl acrylate) |  |  |  |  | 30.0 |
|  |  |  | MMA (Methyl methacrylate) |  |  |  |  | 36.0 |
|  |  |  | BA (n-Butyl acrylate) |  |  |  | 60.0 | 30.0 |
|  |  |  | EHMA (2-Ethylhexyl methacrylate) |  |  |  |  | — |
|  |  |  | n-BMA (n-Butyl methacrylate) |  |  |  |  |  |
|  |  |  | FA-513AS (Tricyclo[5.2.1.0(2,6)]deca-8-yl acrylate) |  |  |  | 35.0 | — |
|  |  |  | DMMA (Dimethyl acrylamide) |  |  |  |  | — |
|  |  |  | GMA (Glycidyl methacrylate) | 5.0 | 5.0 | 5.0 | 5.0 | 4.0 |
|  |  |  | AA (Acrylic acid) | 95.5 | 95.5 | 95.5 |  | — |
|  |  |  | Total | 100.0 | 100.0 | 100.0 | 100.0 | 100.0 |
|  | Component (B) | Component (B-1) | NC-3000-H | 30.0 |  |  |  | — |
|  |  |  | EPICLON 153 |  |  |  |  | — |
|  |  |  | N770 |  | 30.0 |  |  | — |
|  |  |  | HP-7200 |  |  | 30.0 |  | — |
|  |  |  | FX-305 |  |  |  | 30.0 | 30.0 |
|  |  | Component (B-2) | KA-1165 | 10.0 | 10.0 | 10.0 | 10.0 | 10.0 |
|  | Component (C) |  | 2-Phenylimidazole | 0.1 | 0.1 | 0.1 | 0.1 | 0.1 |
|  | Component (D) |  | F05-12 | 25.0 | 25.0 | 25.0 | 25.0 | 25.0 |
|  | Coupling agent |  | A-187 | 0.1 | 0.1 | 0.1 | 0.1 | 0.1 |

TABLE 4-continued

| | | | | | | |
|---|---|---|---|---|---|---|
| SP value | Component (A) | 12.30 | 12.30 | 12.30 | 9.83 | 10.05 |
| | Component (B) | 10.99 | 10.55 | 9.69 | 15.10 | 15.10 |
| | Absolute value of difference between component (A) and component (B) | 1.31 | 1.75 | 2.61 | 5.27 | 5.05 |
| Evaluation results | Varnish properties (compatibility of components) | No | No | No | Separated | Separated |
| | Varnish properties (viscosity) (mPa · s) | 511 | 649 | 503 | 721 | 774 |
| | Tackiness of prepreg (presence or absence of generation of adhesion) | No | No | No | Yes | Yes |
| | Appearance of prepreg (presence or absence of agglomerate) | No | No | Yes | No | No |
| | Storage elastic modulus at 25° C. (Pa) | $0.8 \times 10^9$ | $0.4 \times 10^9$ | $1.1 \times 10^9$ | — | — |
| | Tensile strength (Pa) | $12.9 \times 10^9$ | $14.1 \times 10^9$ | $13.1 \times 10^9$ | — | — |
| | Tensile elongation percentage (%) | 3.8 | 4.2 | 2.3 | — | — |
| | Heat resistance (sec) | 110 | 130 | 150 | — | — |
| | Copper foil peeling strength (kN/m) | 0.45 | 0.55 | 0.47 | — | — |
| | Phase structure - Average domain size of island phase (μm) | 23.5 | 26.2 | 28.3 | — | — |
| | Electric insulation reliability (hr) | 450 | 450 | 450 | — | — |

TABLE 5

| | | | Example | | | | | | |
|---|---|---|---|---|---|---|---|---|---|
| | Item | | 15 | 16 | 17 | 18 | 19 | 20 | 21 |
| Blending composition (parts by mass) | Component (A) | KH-CT-865 | 10.0 | 30.0 | 20.0 | 50.0 | 30.0 | 30.0 | 30.0 |
| | | HTR-860 | | | 10.0 | | | | |
| | | HAN5-M90S | | | | | | | |
| | Component (B-1) | N770 | | | | | | 8.0 | |
| | | EPICLON 153 | 47.9 | 31.9 | 31.9 | 15.9 | 31.9 | 23.9 | 23.9 |
| | | NC-3000-H | | | | | | | 8.0 |
| | | 4005P | | | | | | | |
| | Component (B-2) | KA-1165 | 12.0 | 8.0 | 8.0 | 4.0 | 8.0 | 8.0 | 8.0 |
| | Component (C) | 2-Phenylimidazole | 0.1 | 0.1 | 0.1 | 0.1 | 0.1 | 0.1 | 0.1 |
| | Component (D-1) | SC-2050KC | 15.0 | 15.0 | 15.0 | 15.0 | | 15.0 | 15.0 |
| | Component (D-2) | HK-001 | 15.0 | 15.0 | 15.0 | 15.0 | | 15.0 | 15.0 |
| | | F05-12 | | | | | 15.0 | | |
| | | F05-30 | | | | | | | |
| | Coupling agent | A-187 | | | | | 0.1 | | |
| Evaluation results | Varnish properties (compatibility of components) | | No | No | No | No | No | No | No |
| | Tackiness of prepreg (presence or absence of generation of adhesion) | | No | No | No | No | No | No | No |
| | Appearance of prepreg (presence or absence of agglomerate) | | No | No | No | No | No | No | No |
| | Storage elastic modulus at 25° C. (Pa) | | $1.8 \times 10^9$ | $0.7 \times 10^9$ | $0.8 \times 10^9$ | $0.6 \times 10^9$ | $0.9 \times 10^9$ | $0.9 \times 10^9$ | $1.1 \times 10^9$ |
| | Tensile elongation percentage (%) | | >3 | >3 | >3 | >3 | >3 | >3 | >3 |
| | Heat resistance (sec) | | >300 | >300 | >300 | >300 | >300 | >300 | >300 |
| | Copper foil peeling strength (kN/m) | | 1.0 | 0.8 | 0.8 | 0.7 | 0.8 | 0.9 | 0.9 |
| | Phase structure - Average domain size of island phase (μm) | | 4.5 | 3.0 | 3.5 | 2.0 | 3.0 | 4.0 | 6.0 |
| | Electric insulation reliability (hr) | | >2000 | >2000 | >2000 | >2000 | >2000 | >2000 | >2000 |

| | | | Example | | | | | | |
|---|---|---|---|---|---|---|---|---|---|
| | Item | | 22 | 23 | 24 | 25 | 26 | 27 | 28 |
| Blending composition (parts by mass) | Component (A) | KH-CT-865 | 30.0 | 30.0 | 50.0 | 10.0 | | | |
| | | HTR-860 | | | | | | | |
| | | HAN5-M90S | | | | | 30.0 | 30.0 | 20.0 |
| | Component (B-1) | N770 | | 39.9 | | | 39.9 | | 31.9 |
| | | EPICLON 153 | 23.9 | | 23.9 | 55.9 | | | |
| | | NC-3000-H | | | | | | 39.9 | |
| | | 4005P | 8.0 | | | | | | |
| | Component (B-2) | KA-1165 | 8.0 | 10.0 | 6.0 | 14.0 | 10.0 | 10.0 | 8.0 |
| | Component (C) | 2-Phenylimidazole | 0.1 | 0.1 | 0.1 | 0.1 | 0.1 | 0.1 | 0.1 |
| | Component (D-1) | SC-2050KC | 15.0 | | | | | | 20.0 |

TABLE 5-continued

|  |  |  |  |  |  |  |  |  |  |
|---|---|---|---|---|---|---|---|---|---|
| | Component (D-2) | HK-001 | 15.0 | | | | | | 20.0 |
| | | F05-12 | | 20.0 | 20.0 | 20.0 | 20.0 | 20.0 | |
| | | F05-30 | | | | | | | |
| | Coupling agent | A-187 | | | | | | | |
| Evaluation results | Varnish properties (compatibility of components) | | No | No | No | No | No | No | No |
| | Tackiness of prepreg (presence or absence of generation of adhesion) | | No | No | No | No | No | No | No |
| | Appearance of prepreg (presence or absence of agglomerate) | | No | No | No | No | No | No | No |
| | Storage elastic modulus at 25° C. (Pa) | | 1.1 × 10$^9$ | 0.7 × 10$^9$ | 0.6 × 10$^9$ | 1.8 × 10$^9$ | 0.6 × 10$^9$ | 1.2 × 10$^9$ | 1.9 × 10$^9$ |
| | Tensile elongation percentage (%) | | >3 | >3 | >3 | >3 | >3 | >3 | >3 |
| | Heat resistance (sec) | | >300 | >300 | >300 | >300 | >300 | >300 | >300 |
| | Copper foil peeling strength (kN/m) | | 0.9 | 0.8 | 0.7 | 1.0 | 0.8 | 0.9 | 0.7 |
| | Phase structure - Average domain size of island phase (μm) | | 7.0 | 3.0 | 2.0 | 4.5 | 3.0 | 4.5 | 8.0 |
| | Electric insulation reliability (hr) | | >2000 | >2000 | >2000 | >2000 | >1000 | >1000 | >1000 |

TABLE 6

| | | | Example | | | | | | | | |
|---|---|---|---|---|---|---|---|---|---|---|---|
| | Item | | 29 | 30 | 31 | 32 | 33 | 34 | 35 | 36 | 37 |
| Blending composition (parts by mass) | Component (A) | KH-CT-865 | 10.0 | 30.0 | 20.0 | 50.0 | 30.0 | 30.0 | 30.0 | 30.0 | 30.0 |
| | | HTR-860 | | | 10.0 | | | | | | |
| | | HAN5-M90S | | | | | | 8.0 | | | 8.0 |
| | Component (B-1) | N770 | | | | | | | | | |
| | | EPICLON 153 | 48.0 | 32.0 | 32.0 | 16.0 | 32.0 | 24.0 | 24.0 | 24.0 | 24.0 |
| | | NC-3000-H | | | | | | | 8.0 | | |
| | | 4005P | | | | | | | | 8.0 | |
| | Component (B-2) | KA-1165 | 10.4 | 7.0 | 7.0 | 3.4 | 7.0 | 7.0 | 7.0 | 7.0 | 7.9 |
| | | LA-7054 | 1.5 | 0.9 | 0.9 | 0.5 | 0.8 | 0.9 | 0.9 | 0.9 | |
| | Component (C) | 2-Phenylimidazole | 0.1 | 0.1 | 0.1 | 0.1 | 0.1 | 0.1 | 0.1 | 0.1 | 0.1 |
| | Component (D-1) | SC-2050KC | 15.0 | 15.0 | 15.0 | 15.0 | 15.0 | 15.0 | 15.0 | 15.0 | |
| | Component (D-2) | HK-001 | 15.0 | 15.0 | 15.0 | 15.0 | | 15.0 | 15.0 | 15.0 | |
| | | F05-12 | | | | | 15.0 | | | | 30.0 |
| | | F05-30 | | | | | — | | | | |
| | Coupling agent | A-187 | | | | | 0.1 | | | | |
| Evaluation results | Varnish properties (compatibility of components) | | No | No | No | No | No | No | No | No | No |
| | Tackiness of prepreg (presence or absence of generation of adhesion) | | No | No | No | No | No | No | No | No | No |
| | Appearance of prepreg (presence or absence of agglomerate) | | No | No | No | No | No | No | No | No | No |
| | Storage elastic modulus at 25° C. (Pa) | | 1.8 × 10$^9$ | 0.7 × 10$^9$ | 0.8 × 10$^9$ | 0.6 × 10$^9$ | 0.9 × 10$^9$ | 0.9 × 10$^9$ | 1.1 × 10$^9$ | 1.1 × 10$^9$ | 1.6 × 10$^9$ |
| | Tensile elongation percentage (%) | | >3 | >3 | >3 | >3 | >3 | >3 | >3 | >3 | 2.4 |
| | Heat resistance (sec) | | >300 | >300 | >300 | >300 | >300 | >300 | >300 | >300 | 250 |
| | Copper foil peeling strength (kN/m) | | 1.0 | 0.8 | 0.8 | 0.7 | 0.8 | 0.9 | 0.9 | 0.9 | 0.7 |
| | Phase structure - Average domain size of island phase (μm) | | 4.5 | 3.0 | 3.5 | 2.0 | 3.0 | 4.0 | 6.0 | 7.0 | 3.5 |
| | Electric insulation reliability (hr) | | >2000 | >2000 | >2000 | >2000 | >2000 | >2000 | >2000 | >2000 | >2000 |

Details of the components in each of the tables are as follows.

[Component (A)]

KH-CT-865: Acrylic polymer containing a methacrylic acid ester as a compound represented by the general formula (A1) having a cycloalkyl group having 5 to 10 carbon atoms in an ester moiety thereof and not containing a nitrile group in the structure thereof (a trade name, manufactured by Hitachi Chemical Company, Ltd., weight average molecular weight Mw=45×10$^4$ to 65×10$^4$, epoxy equivalent: 3,300 g/eq)

HTR-860: Acrylic polymer not containing a nitrile group in the structure thereof (a trade name, manufactured by Nagase ChemteX Corporation, weight average molecular weight Mw=80×10$^4$, epoxy equivalent: 2,900 g/eq)

HAN5-M90S: Acrylic polymer containing a nitrile group in the structure thereof (a trade name, manufactured by Negami Chemical Industrial Co., Ltd., weight average molecular weight Mw=90×10$^4$)

[Component (B)]

NC-3000-H: Biphenyl aralkyl type epoxy resin (a trade name, manufactured by Nippon Kayaku Co., Ltd., epoxy equivalent: 290 g/mol)

EPICLON 153: Tetrabromobisphenol A type epoxy resin (a trade name, manufactured by DIC Corporation, epoxy equivalent: 400 g/mol)

N770: Phenol novolak type epoxy resin (a trade name, manufactured by DIC Corporation)

HP-7200: Dicyclopentadiene type epoxy resin (a trade name, manufactured by DIC Corporation)

FX-305: Phosphorus-containing epoxy resin (a trade name, manufactured by Nippon Steel & Sumikin Chemical Co., Ltd.)

KA-1165: Cresol novolak resin (a trade name, manufactured by DIC Corporation, SP value: 12.76. phenol hydroxy group equivalent: 119 g/mol)

LA-7054: Amino triazine novolak type phenol resin (a trade name, manufactured by DIC Corporation)

4005P: Bisphenol F type epoxy resin (a trade name, manufactured by Mitsubishi Chemical Corporation)

[Component (D)]

F05-12: Crushed silica (a trade name, manufactured by Fukushima Yogyo Ltd., average particle diameter: 2.5 μm)

F05-30: Crushed silica (a trade name, manufactured by Fukushima Yogyo Ltd., average particle diameter: 4.2 μm)

HK-001: Aluminum hydroxide (a trade name, manufactured by Kawai Lime Industry Co., Ltd., average particle diameter: 4.0 μm)

SC-2050KC: Silane coupling-treated fused spherical silica (a trade name, manufactured by Admatechs Co., Ltd., average particle diameter: 0.5 μm)

[Coupling Agent]

A-187: γ-Glycidoxypropyltrimethoxysilane (a trade name, manufactured by Momentive Performance Materials Inc.)

As is clear from Tables 2 to 6, Examples 1 to 37 of the present invention are excellent in all of low elasticity, flexibility, strength, heat resistance, adhesive properties to a metal foil, and insulation reliability, and by controlling the SP value, it is possible to control and reveal the characteristic features, such as low elasticity and high strength, according to the use environment and use application. On the other hand, Comparative Examples 1 to 10 are not excellent in all of low elasticity, flexibility, strength, heat resistance, adhesive properties to a metal foil, and insulation reliability Specifically, the aforementioned Comparative Examples are each one in which the following items were investigated.

Comparative Examples 1 to 4 are those in which the acrylic polymer is fixed (Acrylic Polymer F, SP value: 12.10), and the epoxy resin is changed to EPICLON 153 (SP value: 14.15), NC-3000H (SP value: 10.99), N770 (SP value: 10.55), and HP7200 (SP value: 9.69), respectively. As a result, it is noted that the average domain size of the island phase is more than 20 μm, and these Comparative Examples are inferior in the tensile elongation percentage and electric insulation reliability.

Comparative Examples 5 to 8 are also those in which the acrylic polymer is fixed (Acrylic Polymer G, SP value: 12.30), and the epoxy resin is changed to EPICLON 153 (SP value: 14.15), NC-3000H (SP value: 10.99), N770 (SP value: 10.55), and HP7200 (SP value: 9.69), respectively. As a result, it is noted that the average domain size of the island phase is more than 20 μm, and these Comparative Examples are inferior in the tackiness, appearance, heat resistance, domain size of the island phase, and electric insulation reliability.

Comparative Examples 9 to 10 are those in which the acrylic polymer is Acrylic Polymer C (SP value: 9.83) and Acrylic Polymer D (SP value: 10.05), respectively, and the epoxy resin is FX-305 (SP value: 15.1). According to the results, it is noted that these Comparative Examples are inferior in the varnish properties and tackiness.

FIG. 7 is an SEM photograph indicating a cross-sectional structure of a cured material obtained from the resin composition of Example 2, and it was confirmed that a sea-island structure is formed.

FIG. 10 is a curve of a loss factor tan δ of the resin composition of Example 2, and two peaks were observed. The peak at the low-temperature side is a peak originated from the acrylic polymer, and the peak at the high-temperature side is a peak originated from the thermosetting resin (B). According to this, it is noted that in the resin composition of Example 2, a sea-island structure is formed.

FIG. 11 and FIG. 12 are each a curve of a loss factor tan δ of the resin compositions of Examples 7 and 12, respectively. In each of these Examples, in view of the fact that two peaks are observed, it is noted that a phase separation structure is formed.

FIG. 9 is a cross-sectional SEM photograph of a cured material obtained in Example 12, and though it is difficult to confirm a sea-island structure, in view of the fact that two peals are confirmed in a curve of a loss factor tan δ, it can be judged that a phase separation structure is formed.

Similar to the aforementioned Example 12, in Examples 8 and 13, though it was difficult to observe the domain of the second phase through the SEM observation, in view of the fact that two peaks are confirmed in a curve of a loss factor tan δ, it can be judged that a phase separation structure is formed; and in view of the fact that the domain was not confirmed through the SEM observation, it is noted that the island phase domain is formed in a nano size of less than 1 μm at which the observation is difficult by SEM.

REFERENCE SIGNS LIST

A: Region which is enlarged and shown in (b) of FIG. 13
1: Sea phase
2: Island phase
3: Filler existent in sea phase
4: Filler existent in island filler

The invention claimed is:

1. A prepreg, which is prepared by impregnating a base material with a resin composition comprising an acrylic polymer (A) and a thermosetting resin (B), wherein a phase separation structure of a first phase containing the acrylic polymer (A) and a second phase containing the thermosetting resin (B) is formed, and an average domain size of the second phase is 20 μm or less,
   wherein in case that ten sheets of the prepreg which were processed into a size of 250 mm×250 mm are superimposed and put into a hermetically sealable bag, which is then charged in a constant-temperature and constant-humidity environment at a temperature of 25° C. and a humidity of 70% for 48 hours, the prepreg arranged in the bottom and the prepreg adjacent thereto are separated from each other,
   wherein a solubility parameter (SP value) of the acrylic polymer (A) is from 9.0 to 12.0, and
   wherein an absolute value of a difference between the solubility parameter (SP value) of the acrylic polymer (A) and a solubility parameter (SP value) of the thermosetting resin (B) is from 0.1 to 5.0.

2. The prepreg according to claim 1, wherein the acrylic polymer (A) is an acrylic polymer containing a (meth) acrylic acid ester-derived structural unit represented by the following general formula (A1):

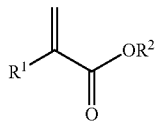 (A1)

wherein $R^2$ represents an alkyl group, a cycloalkyl group, a cycloalkylalkyl group, an aryl group, or an aralkyl group; and $R^1$ represents a hydrogen atom or a methyl group.

3. The prepreg according to claim 1, wherein the solubility parameter (SP value) of the acrylic polymer (A) is from 9.4 to 11.6.

4. The prepreg according to claim 1, wherein a weight average molecular weight of the acrylic polymer (A) is from 100,000 to 1,500,000.

5. The prepreg according to claim 1, wherein the content of the acrylic polymer (A) is from 10 to 50 parts by mass based on 100 parts by mass of the total solid content of the resin composition.

6. The prepreg according to claim 1, wherein the thermosetting resin (B) is at least one selected from the group consisting of an epoxy resin, a cyanate resin, a bismaleimide, an addition polymer of a bismaleimide and a diamine, a phenol resin, a resole resin, an isocyanate resin, triallyl isocyanurate, triallyl cyanurate, and a vinyl group-containing polyolefin compound.

7. The prepreg according to claim 1, wherein the phase separation structure is a sea-island structure, a sea phase is constituted of the first phase, and an island phase is constituted of the second phase.

8. The prepreg according to claim 1, wherein the solubility parameter (SP value) of the thermosetting resin (B) is from 9.0 to 15.0, provided that the absolute value of a difference between the solubility parameter (SP value) of the acrylic polymer (A) and the solubility parameter (SP value) of the thermosetting resin (B) is from 0.1 to 5.0.

9. The prepreg according to claim 1, wherein the absolute value of a difference between the solubility parameter (SP value) of the acrylic polymer (A) and the solubility parameter (SP value) of the thermosetting resin (B) is from 0.11 to 4.9.

10. The prepreg according to claim 1, wherein the absolute value of a difference between the solubility parameter (SP value) of the acrylic polymer (A) and the solubility parameter (SP value) of the thermosetting resin (B) is from 0.12 to 4.8.

11. The prepreg according to claim 1, wherein the absolute value of a difference between the solubility parameter (SP value) of the acrylic polymer (A) and the solubility parameter (SP value) of the thermosetting resin (B) is from 0.13 to 4.7.

12. A laminate plate, which is prepared by laminating the prepreg according to claim 1, and then heating and pressurizing.

13. A printed wiring board, which is prepared by subjecting the laminate plate according to claim 12 to circuit processing.

* * * * *